United States Patent [19]
Katsube

[11] Patent Number: 5,828,119
[45] Date of Patent: Oct. 27, 1998

[54] MOS LSI WITH PROJECTION STRUCTURE

[75] Inventor: Masaki Katsube, Kawasaki, Japan

[73] Assignee: Fujitsu Limited, Kawasaki, Japan

[21] Appl. No.: 976,006

[22] Filed: Nov. 21, 1997

Related U.S. Application Data

[63] Continuation of Ser. No. 538,855, Oct. 4, 1995, abandoned.

[30] Foreign Application Priority Data

Oct. 6, 1994 [JP] Japan ................... 6-243141

[51] Int. Cl.[6] .................................................. H01L 27/08
[52] U.S. Cl. .......................... 257/491; 257/546; 257/551
[58] Field of Search .................... 257/356, 357, 257/360, 361, 491, 546, 369, 551

[56] References Cited

U.S. PATENT DOCUMENTS

| | | | |
|---|---|---|---|
| 3,667,009 | 5/1972 | Rugg | 317/235 |
| 3,712,995 | 1/1973 | Steudel | 257/357 |
| 5,159,518 | 10/1992 | Roy | 361/56 |

FOREIGN PATENT DOCUMENTS

| | | | |
|---|---|---|---|
| 1-128465 | 5/1989 | Japan | 257/357 |
| 1-194349 | 8/1989 | Japan | 257/357 |

*Primary Examiner*—Donald Monin
*Attorney, Agent, or Firm*—Armstrong, Westerman, Hattori, McLeland & Naughton

[57] ABSTRACT

A semiconductor device having: a semiconductor substrate of a first conductivity type; a well formed in a surface of said semiconductor substrate, the welt being of a second conductivity type opposite to the first conductivity type; a first MOS transistor formed in a surface of a first conductivity type region of the semiconductor substrate; a second MOS transistor formed in a surface of the well; a wiring connected to the gate electrodes of the first and second MOS transistors; and a protection diode with a p-n junction formed in the first conductivity type region and comprising a second conductivity type region electrically connected to the wiring and the first conductivity region of the semiconductor substrate, wherein the wiring and the well are not directly connected electrically. A CMOS type semiconductor integrated circuit device with a long and wide area wiring is realized which can effectively suppress damage to a gate oxide film of a MOSFET.

13 Claims, 23 Drawing Sheets

MOS LSI WITH PROJECTION STRUCTURE

This application is a continuation of application Ser. No. 08/538,855 filed Oct. 4, 1995, now abandoned.

BACKGROUND OF THE INVENTION a) Field of the Invention

The present invention relates to a semiconductor integrated circuit device having MOSFETs, and more particularly to a CMOS semiconductor integrated circuit device having very long and wide area wirings.

b) Description of the Related Art

As semiconductor integrated circuits become fine and gate oxide films of MOSFETs become thin, gate oxide films become likely to be deteriorated or damaged during manufacturing processes. Damaged gate oxide films pose problems of a variation of a MOSFET threshold voltage and low reliability.

These problems are likely to occur when a very long and wide area wiring is connected to a gate electrode. One of the reasons of damaging a gate oxide film may be electric charges accumulated on a wiring layer connected to a gate electrode during manufacturing processes which electric charges may cause tunnelling current through the gate oxide film and result in a dielectric breakdown of the gate oxide film. U.S. patent application Ser. No. 08/275,426 filed on Jul. 15, 1994, is incorporated herein by reference.

Accumulation of electric charges on a wiring layer during manufacturing processes may be considered as resulting from a large aspect ratio of an opening in a resist mask formed on a wiring layer which leads to an excess amount of positive charges than the amount of electrons incident upon the opening. Even if an opening has a large aspect ratio, electric charges are prevented from being accumulated on a wiring layer if processes ensuring the equal amounts of positive and negative charges are realized. It is very difficult, however, to realize such processes.

It is possible to reduce damage to a gate oxide film by limiting the length and area of a wiring connected to the gate electrode. However, this is practically difficult from the following reasons.

FIG. 12B is a circuit diagram of a CMOS type NAND circuit. A parallel circuit of p-channel MOS transistors PM1 and PM2 and a serial circuit of n-channel MOS transistors NM1 and NM2 are serially connected.

One input signal IN1 is applied to the gate electrodes of the MOS transistors PM1 and NM1, and the other input signal IN2 is applied to the gate electrodes of the MOS transistors PM2 and NM2. An output signal OUT is obtained from the interconnection between the parallel circuit of the p-channel MOS transistors PM1 and PM2 and the serial circuit of the n-channel MOS transistors NM1 and NM2.

The four transistors shown in FIG. 12B are usually formed closely one another on a substrate. However, pre-stage circuits for supplying the input signals IN1 and IN2 are not always formed near each other. If the AND circuit is formed near one pre-stage circuit for supplying one input signal, a wiring for the other input signal becomes long. It is therefore difficult to lay out a circuit with a plurality of input terminals so that all input wirings become short.

Another means for reducing electric charges stored on a wiring connected to a gate electrode is to connect a diode for protecting the gate electrode. Electric charges on a wiring layer are discharged via the diode.

FIG. 12A shows a conventional circuit for preventing electric charges from being accumulated on a wiring layer connected to a gate electrode.

A p-channel MOS transistor PM3 and an n-channel MOS transistor NM3 are serially connected. An input signal is supplied to the gate electrodes of the transistors PM3 and NM3 from a pre-stage circuit PS via a long and wide area input wiring line. The gate electrodes of the transistors PM3 and NM3 are connected via a protection diode D1 to an n-type well in which the p-channel MOS transistor PM3 is formed, and also connected via a protection diode D2 to a p-type well in which the n-channel MOS transistor NM3 is formed. Each diode D1, D2 is connected in a reverse biased direction at a normal operation voltage.

When a positive high potential is generated by electric charges on an input wiring layer, current flows via the protection diode D1 into the n-type well, whereas when a negative high potential is generated, current flows via the protection diode D2 into the p-type well. In this manner, electric charges accumulated on the input wiring layer are discharged via the protection diode D1 or D2 into the n- or p-type well. It is therefore possible to prevent a high electric field from being applied to the gate oxide film.

As shown in FIGS. 12A and 12B, input wirings of a CMOS circuit are connected to both n- and p-channel MOS transistors. As shown in FIG. 12A, for one input wiring, two protection diodes are required to be connected in association with the n- and p-channel MOS transistors. Therefore, an area occupied by the CMOS circuit becomes large in opposition to the demands for high integration.

SUMMARY OF THE INVENTION

It is an object of the present invention to provide a semiconductor device capable of effectively suppressing damage to a gate oxide film of a MOSFET.

It is another object of the present invention to provide a semiconductor device capable of effectively suppressing damage to a gate oxide film of a MOSFET in a CMOS circuit, without occupying a large substrate area.

According to one aspect of the present invention, there is provided a semiconductor device comprising: a semiconductor substrate of a first conductivity type; a well formed in a surface of the semiconductor substrate, the well being of a second conductivity type opposite to the first conductivity type; a first MOS transistor formed in a surface of a first conductivity type region of the semiconductor substrate, the first MOS transistor having a gate electrode, with a gate insulating film being interposed under the gate electrode; a second MOS transistor formed in a surface of the well, the second MOS transistor having a gate electrode, with a gate insulating film being interposed under the gate electrode; a wiring connected to the gate electrodes of the first and second MOS transistors; and a protection diode with a p-n junction formed in the first conductivity type region of the semiconductor substrate, and comprising a second conductivity type region electrically connected to the wiring and the first conductivity type region of the semiconductor substrate, wherein the wiring and the well are not connected electrically directly nor through a diode.

If a gate electrode is charged in a forward bias direction with respect to the protection diode inserted between the gate electrode and the semiconductor substrate, forward current flows through the protection diode so that charges accumulated on the gate electrode can be discharged to the substrate. If the gate electrode is charged in a reverse bias direction with respect to the protection diode, reverse current flows through the protection diode when a voltage higher than the reverse breakdown voltage is applied to the protection diode, and charges accumulated on the gate electrode can be discharged to the substrate.

Since the substrate has a large electrostatic capacitance, even if charges are accumulated therein, a potential change of the substrate is small. Therefore, by discharging electric charges accumulated on the gate electrode to the substrate, a voltage applied to the gate oxide film can be lowered so that dielectric breakdown of the gate oxide film can be avoided and a change in the threshold voltage of a MOS transistor can be suppressed.

The total area of the wiring may be a 500-fold or more of a sum of a gate electrode area of the first MOS transistor and a gate electrode area of the second MOS transistor respectively disposed on the gate insulating film.

If the total area of the wiring connected to a gate electrode is a 500-fold or more of the gate electrode area on the gate oxide film, the gate oxide film is likely to be damaged. Therefore, inserting the protection diode is particularly effective for such a wiring connected to the gate electrode.

The wiring may be a multi-layer wiring having a plurality of wiring layers. In this case, a total area of the plurality of wiring layers sequentially connected from the gate electrodes of the first and second MOS transistors to upper level wiring layers, may be a 500-fold or more of a sum of gate electrode areas of the first MOS transistor and the second MOS transistor respectively disposed on the gate insulating film.

In the case of electric charges accumulated on the wiring during a plasma process of forming the wiring, another wiring covered with an interlevel insulating film is not charged. Therefore, of wiring layers, those layers not connected to the gate electrode do not become cause of damage to the gate oxide film. Damage to a gate oxide film may also be considered as being accumulated each time each wiring layer is patterned. Accordingly, in calculating the wiring area, only the total area of those wirings which are connected to the gate electrode at the same level as, or from a higher level to the gate electrode is considered.

A plurality of active regions surrounded by a field oxide film, may be formed in the surface of the semiconductor substrate, and an area of the second conductivity region of a protection diode in the semiconductor substrate surface may be set equal to a smallest area in the semiconductor substrate surface among areas of impurity doped regions formed in the semiconductor substrate surface.

The protection diode operates effectively even its area is smaller than a minimum area allowed by design rules. With a minimum area of the protection diode, the area occupied by the protection diode can be considerably reduced.

It is preferable that the length of the wiring between the protection diode and the first MOS transistor and a length of the wiring between the protection diode and the second MOS transistor are both a half of, or shorter than, the total length of the wiring. Here, the total length of the wiring is the longest length among lengths from one end to another.

By connecting the protection diode to the wiring at a position on the gate electrode side, which is between the middle point of the wiring and the gate electrode, damage to the gate oxide film can be more effectively suppressed.

The protection diode may comprise a first conductivity type region formed near the p-n junction and having an impurity concentration higher than a channel region under the gate electrode of the first MOS transistor.

If the impurity concentration of the p-n junction of the protection diode is made high, the reverse breakdown voltage lowers. Therefore, electric charges accumulated on the gate electrode wiring can be more efficiently discharged to the substrate.

It is preferable that another diode is formed in the first conductive region of the semiconductor substrate, wherein a distance between the protection diode and a MOS transistor formed nearest to the protection diode is longer than, or equal to, a distance between the other diode and the MOS transistor formed nearest to the protection diode.

By forming a protection diode with a high impurity concentration at a location away from the MOS transistor, it is possible to prevent the threshold voltage of the MOS transistor from being changed by a change in the diffused impurity concentration.

According to another aspect of the present invention, there is provided a method of manufacturing a semiconductor device, comprising the steps of: implanting impurity ions of a first conductivity type into a diode forming region of a semiconductor substrate of the first conductivity type, the impurity ions being implanted to a first depth as an average ion implantation depth; subjecting the semiconductor substrate to a thermal treatment to activate the impurity ions of the first conductivity type and diffuse the impurity ions to a second depth; implanting impurity ions of a second conductivity type opposite to the first conductivity type into the diode forming region, the impurity ions being implanted to a third depth as an average ion implantation depth deeper than the first depth and shallower than the second depth; and subjecting the semiconductor substrate to a thermal treatment to activate the impurity ions of the second conductivity type.

In order to raise the impurity concentration of a protection diode, a high impurity concentration region of the same conductivity type as the substrate is formed at the interface between the substrate and the impurity region of the conductivity type opposite to the substrate. An ion implantation depth of the high impurity concentration region is made shallower than that of the impurity region of the conductivity type opposite to the substrate. The high impurity concentration region is then diffused deeper by a thermal treatment. In this manner, crystal defects can be prevented from being formed at the p-n junction. Since crystal defects are avoided, it is possible to suppress leak current of the protection diode.

According to a further aspect of the present invention, there is provided a semiconductor integrated circuit device comprising: a semiconductor chip having an internal region surrounded by a scribe line; a plurality of diffusion regions formed in a surface of the semiconductor chip at the internal region, the diffusion regions being doped with impurity; a plurality of MOS transistors each having a pair of diffusion regions among the plurality of diffusion regions and an insulated gate structure formed on the surface of the semiconductor chip between the pair of diffusion regions; and a plurality of wirings each connected to a gate electrode of one of the plurality of MOS transistors and to at least another diffusion region among the plurality of diffusion regions, wherein a distance between the gate electrode of each of the plurality of MOS transistors and a nearest scribe line is almost equal to a distance between one diffusion region connected to the wiring connected to the gate electrode or one of the plurality of diffusion regions connected to said wiring, and being nearest to the gate electrode and a nearest scribe line.

At regions in the substrate having generally the same distance from the scribe line, potentials during a plasma process are almost equal.

According to a still further aspect of the invention, there is provided a semiconductor integrated circuit device comprising: a semiconductor chip having an internal region surrounded by a scribe line; a plurality of diffusion regions formed in a surface of the semiconductor chip at the internal region, the diffusion regions being doped with impurity; a plurality of MOS transistors each having a pair of diffusion regions among the plurality of diffusion regions and an insulated gate structure formed on the surface of the semiconductor chip between the pair of diffusion regions; a plurality of wirings each connected to a gate electrode of one of the plurality of MOS transistors and to at least another diffusion region among the plurality of diffusion regions; and a quasi scribe line formed in the internal region, the quasi scribe line exposing the surface of the semiconductor substrate or a surface of a conductive layer formed on the surface of the semiconductor surface, at the level of the wiring.

As described above, damage to a gate oxide film, to be caused by charges accumulated on a wiring connected to the gate electrode during manufacturing processes, can be suppressed while suppressing an increase of a chip area as much as possible. Reliability and high integration of semiconductor devices can therefore be improved.

DETAILED DESCRIPTION OF THE PREFERRED EMBODIMENTS

A CMOS circuit device is often fabricated by forming a well of a first conductivity type and a well of a second conductivity type opposite to the first conductivity type, in a substrate of either conductivity type and forming MOSFETs of opposite conductivity types in these wells.

Damage to a gate oxide film during manufacturing processes is caused by a potential difference between the gate electrode and the well. In order to prevent this potential difference from being generated, a protection diode has been connected conventionally between the well and the gate electrode. Although the well of the same conductivity type as the substrate may be omitted, this protection diode has been used conventionally.

Among portions or parts of a semiconductor integrated circuit device, one whose potential changes least is the substrate having the largest electrostatic capacitance. It is therefore expected that if a protection diode is connected between a gate electrode and the substrate, generation of a potential difference between the gate electrode and the well can be suppressed.

Figure 1:
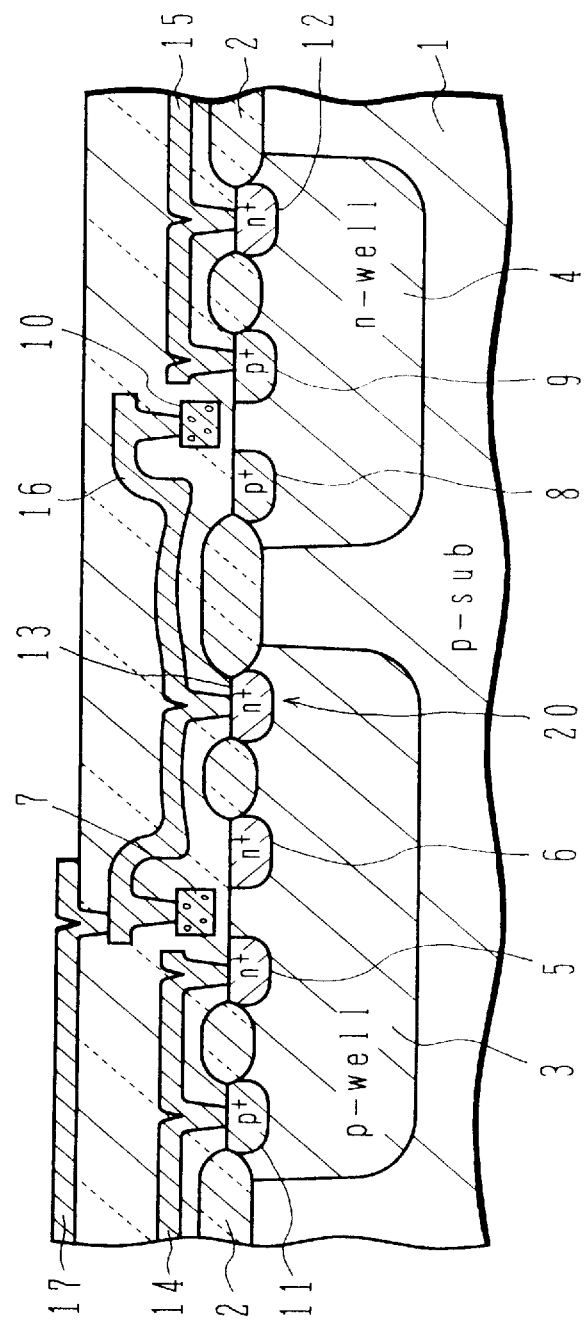
FIG. 1 is a cross sectional view of a CMOS circuit according to an embodiment of the invention.
Figure 2:
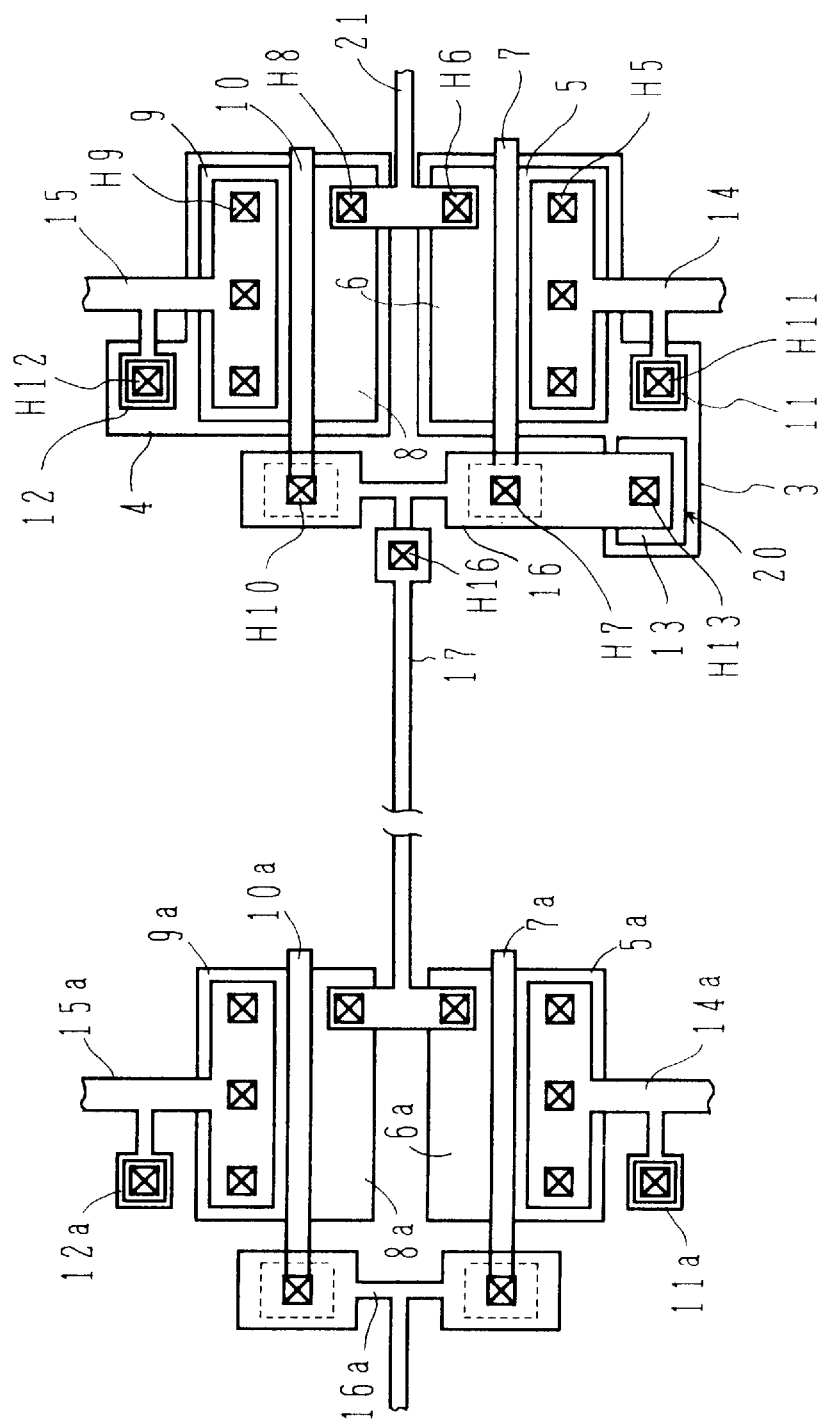
FIG. 2 is a plan view of a CMOS circuit according to an embodiment of the invention.

With reference to FIGS. 1 and 2, a device structure according to an embodiment will be described, by taking as an example a CMOS circuit using a p-type substrate.

FIG. 1 is a cross sectional view of a CMOS circuit device. FIG. 2 is a plan layout of two CMOS circuits inclusive of the CMOS circuit device shown in FIG. 1. The right side of FIG. 2 shows the CMOS circuit of FIG. 1, and the left side shows a pre-stage CMOS circuit. FIG. 1 mainly shows an electrical interconnection between a gate electrode and a protection diode, and is not in precise correspondence with a cross sectional view taken along any line in FIG. 2.

As shown in FIG. 1, a p-type well 3 and an n-type well 4 are formed in the surface of a p-type silicon substrate. An active region in each well surface is defined and surrounded by a field oxide film 2. An n-channel MOS transistor is formed in the active region of the p-type well 3, the n-channel MOS transistor having a gate electrode 7 with a gate oxide film being interposed between the gate electrode and the substrate surface, and n+-type source and drain regions 5 and 6. A p-channel MOS transistor is formed in the active region of the n-type well 4, the p-channel MOS transistor having a gate electrode 10 with a gate oxide film being interposed between the gate electrode and the substrate surface, and p+-type source and drain regions 9 and 8.

In another active region in the p-type well 3, a p+-type well contact 11 is formed. The well contact 11 and source region 5 are connected to a ground potential by a first level wiring layer 14. In another active region in the n-type well 4, an n+-type well contact 12 is formed. The well contact 12 and source region 9 are connected to a power supply voltage line by a first level wiring layer 15.

In another active region in the p-type well 3, an n+-type region 13 is formed. The n+-type region 13 and p-type well 3 form a p-n junction diode 20. The gate electrodes 7 and 10 and the n+-type region 13 are interconnected by a second level wiring layer 16. Since the p-type well 3 and p-type substrate 1 are in ohmic contact, the gate electrodes 7 and 10 are connected to the p-type substrate 1 through the protection diode 20 constituted by the n+-type region 13 and p-type well 3. The second level wiring 16 is connected to a third level long and wide area wiring 17.

In the CMOS circuit shown in FIG. 1 and at the right side of FIG. 2, the protection diode 20 is formed only in the p-type well 3 having the same conductivity type as the substrate As shown in the right side of FIG. 2, the source and drain regions 9 and 8 are formed in the n-type well 4 on the opposite sides of the gate electrode 10. The source region 9 is connected to the power supply wiring 15 via a contact hole H9. The well contact 12 formed in the n-type well 4 is connected to the power supply wiring 15 via a contact hole H12.

The source and drain regions 5 and 6 are formed in the p-type well 3 on the opposite sides of the gate electrode 7. The source region 5 is connected to the ground line 14 via a contact hole H5. The well contact 11 formed in the p-type well 3 is connected to the ground line 14 via a contact hole H11.

The drain regions 6 and 8 are connected to a wiring 21 via contact holes H6 and H8. This wiring 21 is connected to an input terminal of a next stage circuit not shown.

The n+-type region 13 constituting the protection diode 20 is formed in the p-type well 3. The n+-type region 13 and gate electrodes 7 and 10 are connected to the wiring 16 via contact holes H13, H7, and H10. The wiring is connected to the long and wide area wiring 17 via a contact hole H16.

The long and wide area wiring 17 is connected to an output contact (an interconnection of drain regions 6a and 8a of two MOS transistors) of the pre-stage CMOS circuit. The pre-stage CMOS circuit has a similar structure to that of the subject CMOS circuit, excepting that it has no protection diode 20. Each device element of the pre-stage CMOS circuit is represented by a reference numeral with "a" of a corresponding device element of the subject CMOS circuit.

Next, with reference to FIGS. 3A to 3D and FIGS. 4A to 4D, the effects of suppressing damage to gate oxide films of the CMOS circuit having the structure shown in FIG. 1 will be described.

Figure 3A:
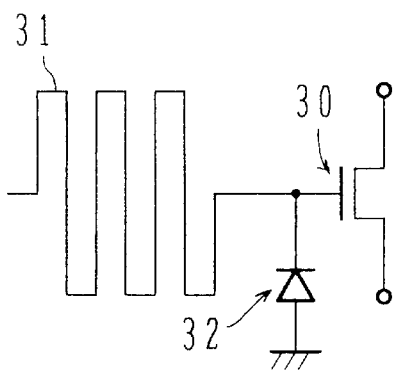
FIGS. 3A to 3D are a circuit diagram and plan views of the circuit ted for experiments for confirming the effects of an embodiment.

FIG. 3A is a circuit diagram of a test element used by experiments for confirming the damage suppression effects. A long and wide area wiring 31 is connected to the gate electrode of a MOS transistor 30. The gate electrode 30 is connected to a ground potential or to a p-type substrate via a protection diode 32. Experiments were conducted by using only p-type substrates. Accordingly, the protection diode 32 is formed in the p-type well, with a terminal on the gate electrode 30 side serving as a cathode, and a terminal on the substrate side serving as an anode.

Experiments were conducted for both the cases where the MOS transistor 30 is an n- and a p-channel MOS transistor. Although the circuit used by the experiments uses only one transistor different from the CMOS circuit shown in FIG. 1, if a p-channel MOS transistor is used as the MOS transistor 30, this circuit is equivalent to the p-channel MOS transistor with the gate electrode 10 shown in FIG. 1, and if an n-channel MOS transistor is used, this circuit is equivalent to the n-channel MOS transistor with the gate electrode 7 shown in FIG. 1.

Figure 3B:
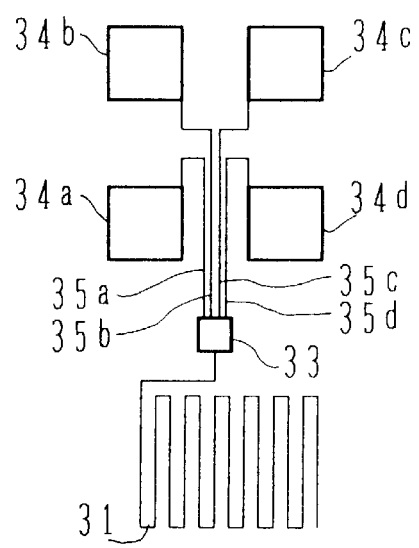

FIG. 3B shows the layout of the circuit shown in FIG. 3A. Four wirings 35a to 35d are led from a MOS transistor forming region 33 and connected to pads 34a to 34d. A long and wide area wiring 31 is patterned in a zigzag shape as shown in FIG. 3B.

Figure 3C:
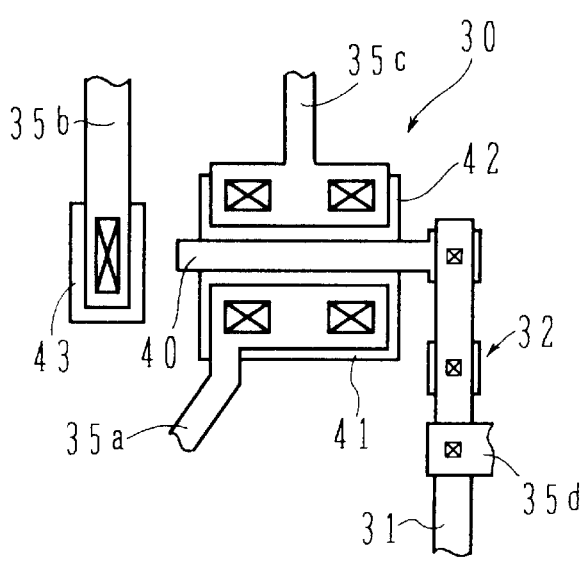

FIG. 3C is an enlarged view of the MOS transistor forming region 33 shown in FIG. 3B. A MOS transistor 30 having a gate electrode 40, source and drain regions 41 and 42 is shown. The gate electrode 40 is connected to the long and wide area wiring 31 of a first level formed on an interlevel insulating film. The protection diode 32 is formed near the interconnection between the long and wide area wiring 31 and gate electrode 40.

The protection diode 32 is formed by a p-n junction between a p-type well and an n+-type region formed in the p-type well. A well contact 43 is formed near the MOS transistor 30. The source region 41, well contact 43, drain region 42, and gate electrode 40 are connected via the wirings 35a, 35b, 35c, and 35d to the pads 34a, 34b, 34c, and 34d.

If the MOS transistor 30 is an n-channel MOS transistor, the MOS transistor 30 and well contact 43 are formed in the p-type well in which the protection diode is formed. If the MOS transistor 30 is a p-channel MOS transistor, the MOS transistor 30 and well contact 43 are formed in the n-type well different from the protection diode 32.

Figure 3D:
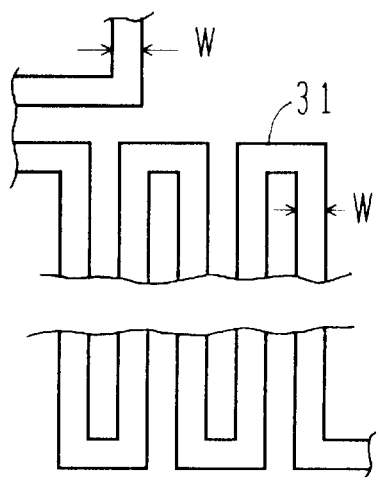

FIG. 3D is an enlarged view of the long and wide area wiring 31. As shown, a wiring having a width W of 1.0 μm is disposed in a zigzag shape with generally the same pitch.

FIGS. 4A to 4D are graphs illustrating a threshold voltage shift of a MOS transistor connected to the long and wide area wiring 31 shown in FIG. 3A, as measured when the protection diode 32 is used or not used.

The abscissas of the graphs of FIGS. 4A to 4D represent a distance to a MOS transistor from a center of a wafer in units of cm. Wafers used were 6-inch wafers. The ordinates of the graphs represent Vth–Vth0 in units of V, where Vth is a threshold voltage of a MOS transistor connected to a long and wide area wiring, and Vth0 is a threshold voltage of a MOS transistor not connected to any tong and wide area wiring. Vth–Vth0 is hereinafter called a threshold voltage shift.

Generally, a threshold voltage changes with variation of manufacturing processes. As shown in FIGS. 4A to 4D, the influence by only a long and wide area wiring can be evaluated by measuring a threshold voltage shift while eliminating the influence by a variation of other factors. The threshold voltage shift amount becomes an index of damage to a gate oxide film.

Figure 4A:
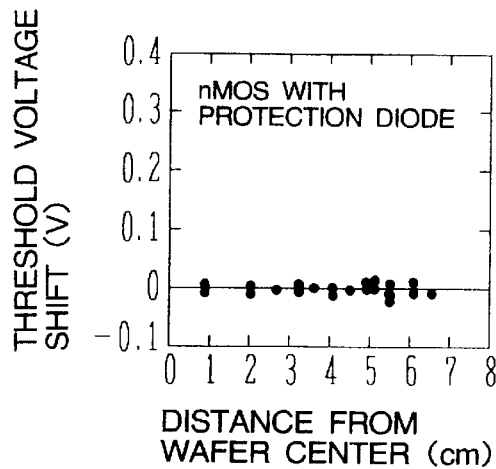
FIGS. 4A to 4D are graphs illustrating the relationship between a distance to a MOS transistor from a wafer center and a transistor threshold voltage shift, as measured when a protection diode is used or not used for a p- or n-channel conductivity type of a MOS transistor.
Figure 4B:
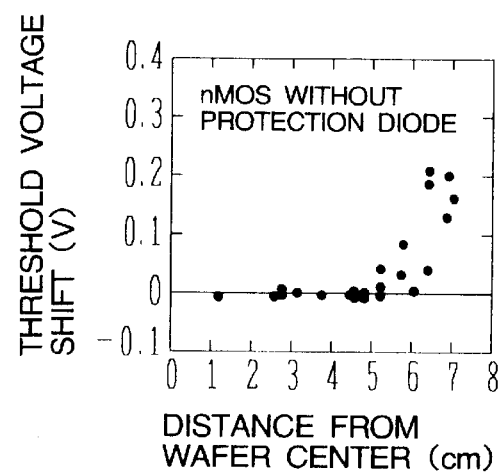
Figure 4C:
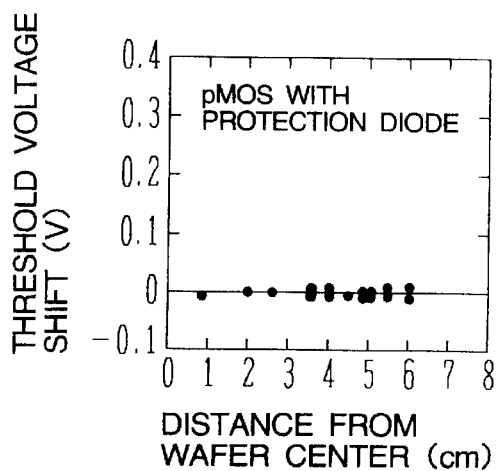
Figure 4D:
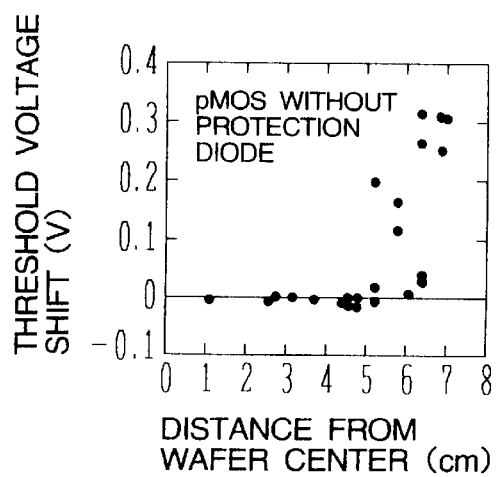

FIGS. 4A and 4C are graphs obtained when the protection diode 32 is used, and FIGS. 4B and 4D are graphs obtained when the protection diode is not used. In the case of FIGS. 4A and 4B, an n-channel MOS transistor is used, and in the case of FIGS. 4C and 4D, a p-channel MOS transistor is used. The circuit used by the experiments has a ratio of 1000 of a bottom area of the long and wide area wiring to an area of the active region under the gate electrode. This ratio is hereinafter called an antenna ratio. The channel length is 0.8 $\mu$m, the channel width is 10 $\mu$m, and the gate oxide film thickness is 10 nm.

As shown in FIGS. 4B and 4D, if no protection diode is used, the threshold voltage shift of MOS transistors formed at the peripheral area of a wafer at a distance from the wafer center in excess of 5 cm is large. In contrast, if a protection diode is used, the threshold voltage shift is very small and approximately 0 over the whole area of the wafer. By inserting the protection diode, the threshold voltage shift can be reduced both for n- and p-channel MOS transistors.

It can be understood from the above data that by inserting one protection diode for one CMOS inverter, i.e. a pair of n-channel and p-channel MOS transistors, damage to the gate oxide films of both the n- and p-type MOS transistors can be suppressed.

A large threshold voltage shift at the peripheral area of a wafer when the protection diode is not inserted may be considered as resulting from that ones of ions or electrons, probably electrons, arc incident upon the peripheral area in an oblique direction to be charged up on the side wall of apertures, whereas the others are normally incident on the peripheral area during a plasma process for patterning a long and wide area wiring and the wiring is easy to be charged.

FIGS. 5A to 5E are graphs illustrating the threshold voltage shift when the protection diode is not used and the antenna ratio is changed. MOS transistors of an n-channel type were used. FIGS. 5A to 5E correspond to antenna ratios of 100, 300, 500, 1000, and 4000, respectively.

Figure 5A:
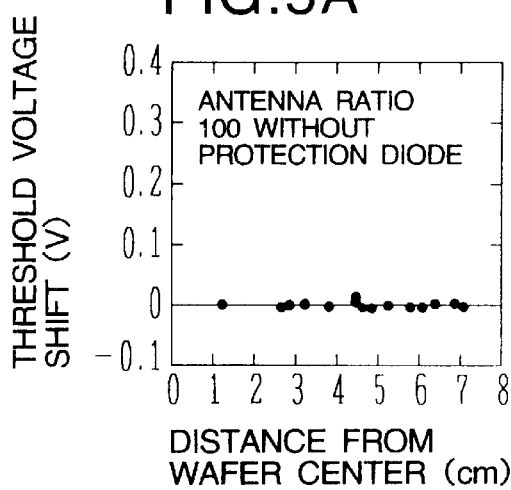
FIGS. 5A to 5E are graphs illustrating the relationship between a distance to a MOS transistor from a wafer center and a transistor threshold voltage shift, as measured for various antenna ratios.
Figure 5B:
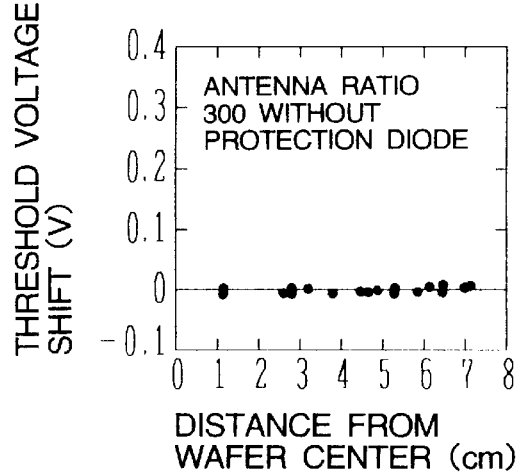
Figure 5C:
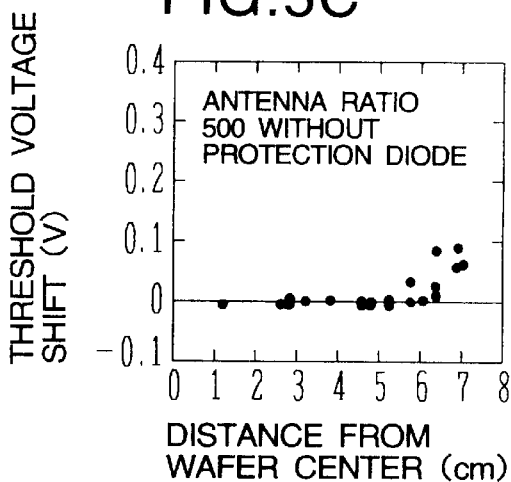
Figure 5D:
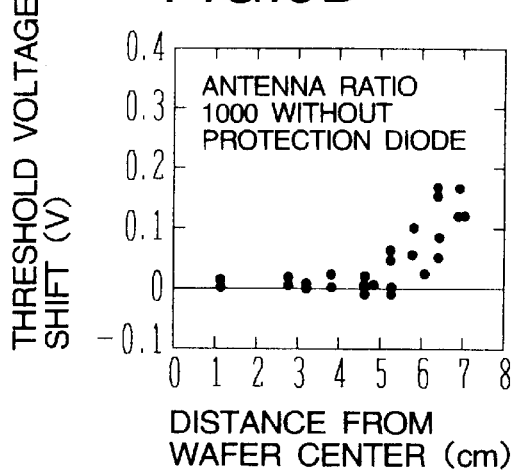
Figure 5E:
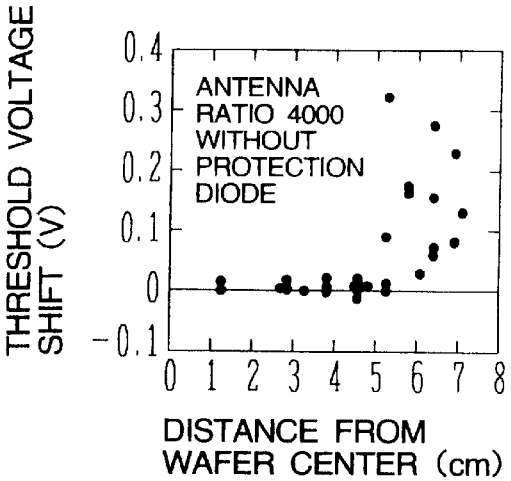

As shown in FIGS. 5A and 5B, at the antenna ratios of 100 and 300, the threshold voltage shift is approximately 0 over the whole area of the wafer even if the protection diode is not inserted. At the antenna ratio of 500, the threshold voltage shift starts increasing in the peripheral area at a distance from the wafer center of 5 cm or more. At a distance from the wafer center of about 7 cm, the threshold voltage shift is about 0.1 V. As seen from FIGS. 5D and 5E, at a larger antenna ratios of 1000 and 4000, the threshold voltage shift further increases.

It can be understood from this data that the larger the antenna ratio, the more the damage to a gate oxide film. It can also be understood from the experiments that damage to a gate oxide film is so little at an antenna ratio of 300 or smaller even if the protection diode is not used, and any practical problem does not occur. The effects of inserting the protection diode at an antenna ratio of 500 or larger are particularly distinctive. A wiring having an antenna ratio of 500 or more will be referred as a long and wide area wiring.

Damage to a gate oxide film may be considered as resulting from that the long and wide area wiring is charged during a plasma process for patterning the wiring, as described earlier. If a long and wide area wiring is made of a plurality of wiring layers, only the uppermost wiring layer is exposed to plasma during the plasma process for forming this wiring layer, and the long and wide area wiring at the low level is protected by the interlevel insulating film so that it establishes no cause for the charge-up of the wiring during this plasma process.

Damage to a gate oxide film may also be considered as depending upon accumulated tunneling current. Therefore, damage to a gate oxide film may be considered to be accumulated each time each wiring layer is patterned. Accordingly, in calculating the antenna ratio, the area of a long and wide area wiring is the total area of wirings connected to the gate electrode at the same level as, or higher levels than the gate electrode wiring, among a plurality of wiring layers.

For example, the pads shown in FIG. 3B are formed by the first level wiring layer, and the gate electrode pad 34$d$ is connected to the gate electrode 40 (shown in FIG. 3C) via the wiring 35$d$ formed by the second level wiring layer. Therefore, the area of the pad 34$d$ is not required to be considered when the antenna ratio is calculated.

However, if there are other factors of charging the long and wide area wiring during processes other than the plasma process for forming the long and wide area wiring, it is preferable to consider the total area of respective wiring layers constituting the long and wide area wiring.

Next, with reference to FIGS. 6A and 6B and FIGS. 7A to 7D, the effects of suppressing damage to a gate oxide film will be described in connection with a rectilinear distance on a wafer between a MOS transistor and a protection diode 32.

Figure 6A:
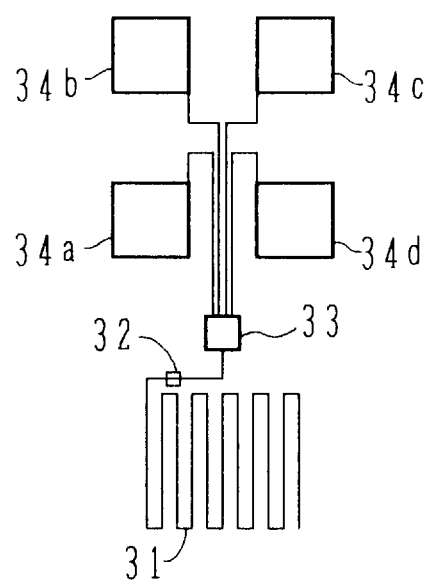
FIGS. 6A and 6B are plan views showing the positions of protection diodes at different distances to MOS transistors.

In the case of FIG. 6A, the distance between a MOS transistor and a protection diode 32 is 100 $\mu$m. The protection diode 32 is formed at an area where the MOS transistor forming region 33 and the zigzag portion of the long and wide area wiring 31 are connected.

Figure 6B:
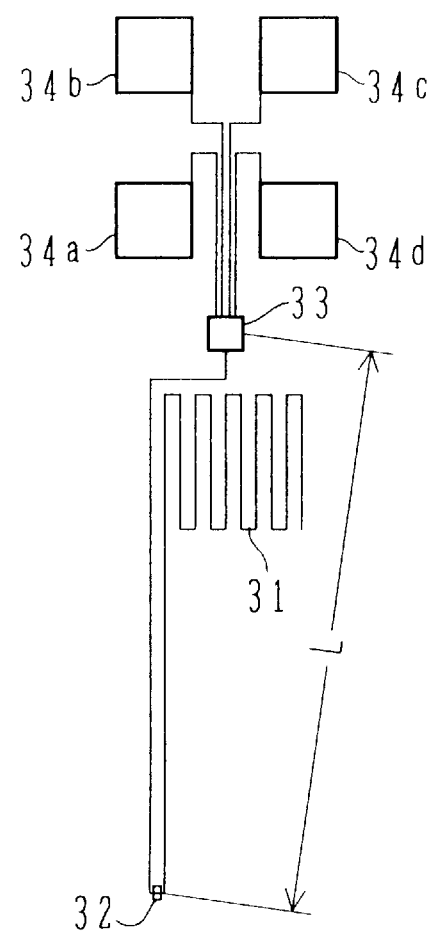

In the case of FIG. 6B, the rectilinear distances L between a MOS transistor and a protection diode 32 are 500 $\mu$m and 1 mm. Part of the long and wide area wiring 31 is elongated downward in FIG. 6B and the protection diode 32 is formed at the lower end of the elongated portion. Test elements having the rectilinear distances L of 500 $\mu$m and 1 mm between the MOS transistor 33 and the protection diode 32 were formed.

The structures of the circuits of both FIGS. 6A and 6B are similar to that shown in FIGS. 3B and 3C except the area where the protection diode is formed. Test elements having a similar structure shown in FIGS. 3B and 3C and having the rectilinear distance of 10 $\mu$m between the protection diode and the MOS transistor were also prepared.

FIGS. 7A to 7D are graphs illustrating the threshold voltage shift at the rectilinear distances of 10 $\mu$m, 100 $\mu$m, 500 $\mu$m, and 1 mm, between the protection diode and the MOS transistor.

Figure 7A:
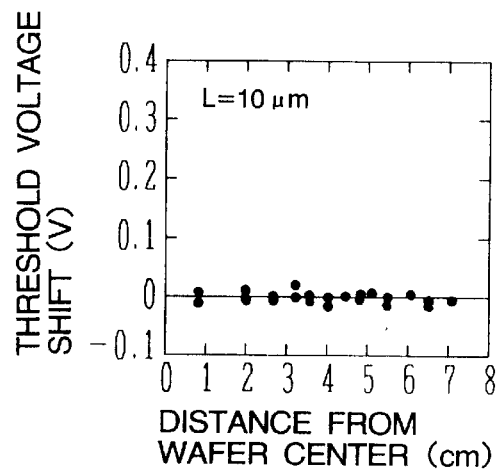
FIGS. 7A to 7D are graphs illustrating the relationship between a distance to a MOS transistor from a wafer center and a transistor threshold voltage shift, as measured for various distances between a protection diode and a MOS transistor.

As shown in FIG. 7A for the distance L of 10 $\mu$m between the protection diode and the MOS transistor, the threshold voltage shift is approximately 0 over the whole area of the wafer. At the distance L of 100 $\mu$m between the protection diode and the MOS transistor shown in FIG. 7B, the threshold voltage shift slightly varies in the peripheral area at a distance in excess of 5 cm from the wafer center.

Figure 7B:
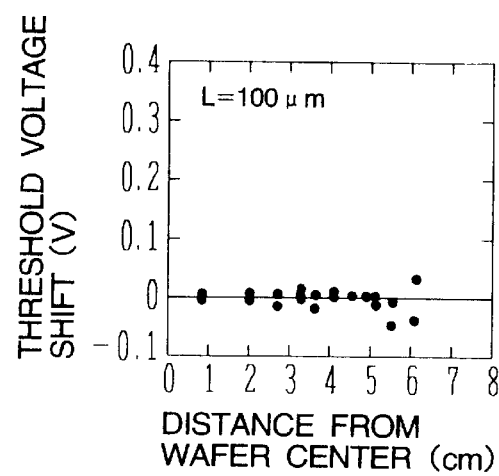
Figure 7C:
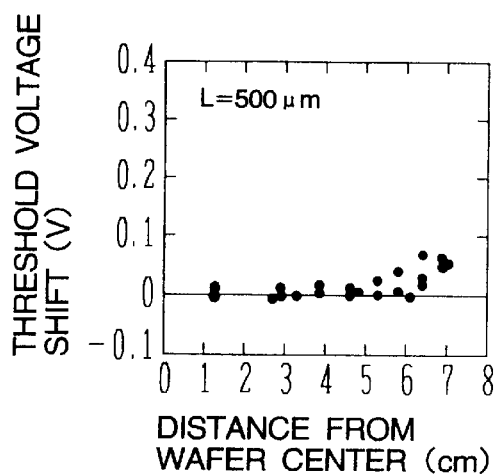
Figure 7D:
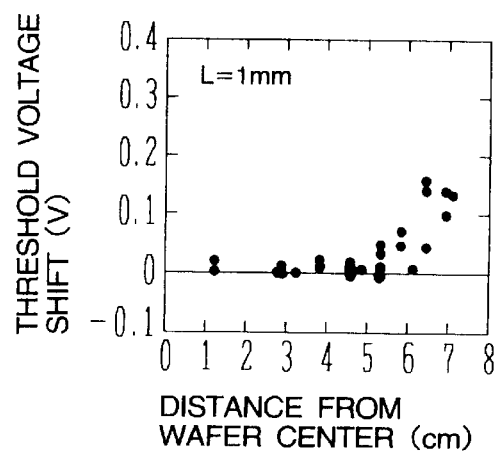

As shown in FIG. 7C for the distance L of 500 $\mu$m between the protection diode and the MOS transistor, the threshold voltage shift becomes large in the peripheral area at a distance of 5 cm or more from the wafer center, and some sample showed a shift of 0.1 V. At the distance L of 1 mm between the protection diode and the MOS transistor, the threshold voltage shift further increases, and some sample showed a shift of 0.15 V.

The experiment data may be considered as resulting from that the potential of the wafer is not uniform over the whole area thereof and if the protection diode and the MOS transistor are positioned away from each other, a potential difference is transiently generated in the gate oxide film. It is therefore preferable to dispose the protection diode and the MOS transistor at as near positions as possible and to set the rectilinear distance to 100 µm or shorter.

If the MOS transistor and the protection diode are disposed away from each other, particularly if the distance therebetween is 100 µm or longer, it is preferable to lower the reverse breakdown voltage of a protection diode in order to suppress damage to the gate oxide film.

Next, with reference to FIG. 8 and FIGS. 9A to 9C, the effects of lowering the reverse breakdown voltage of a protection diode will be described.

Figure 8:
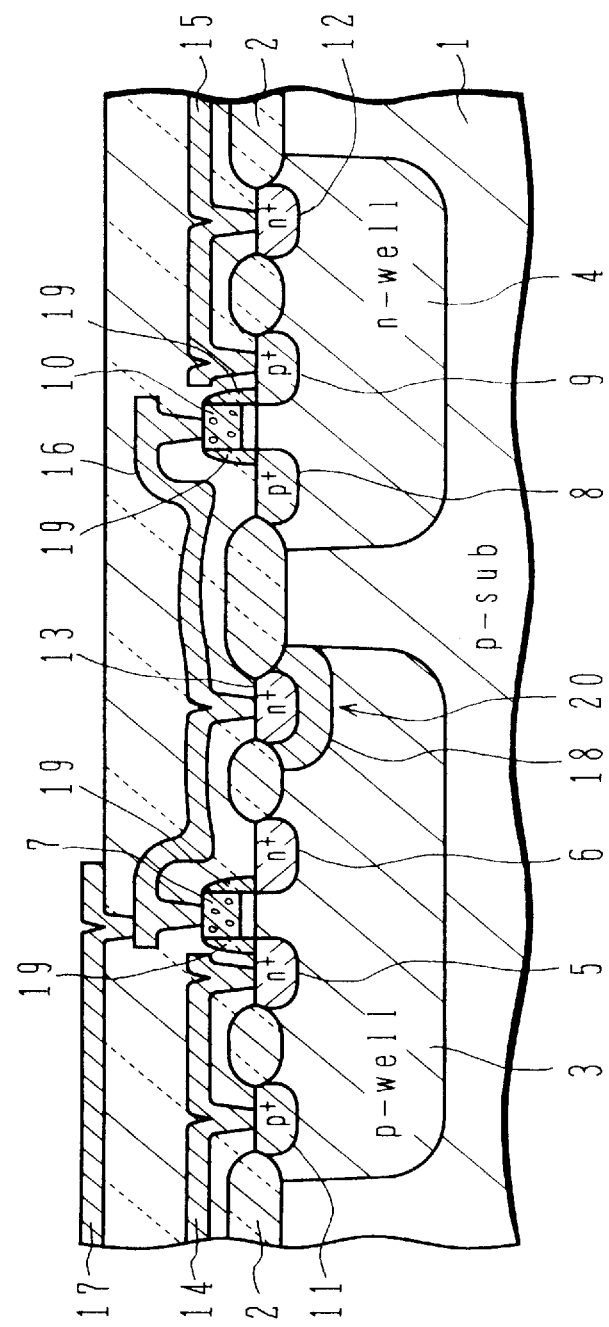
FIG. 8 is a cross sectional view of a CMOS circuit according to another embodiment of the invention.

FIG. 8 is a cross sectional view of a CMOS circuit device with an inserted protection diode. The structure of this CMOS circuit device is similar to that shown in FIG. 1 except the structure of the protection diode 20. The protection diode 20 is formed by an n$^+$-type region 13 and a p-type region 18 having a higher impurity concentration than a p-type well 3, the p-type region 18 being formed between the n$^+$-type region 13 and the p-type well 3. By making the p-type region of the p-n junction have a higher impurity concentration, the reverse breakdown voltage can be lowered. It will be seen that all the conductivity types may be reversed. In both cases, the region forming the pn junction of a protection diode and having the same conductivity type as that of the substrate is preferably raised by additional doping.

A method of manufacturing the CMOS structure shown in FIG. 8 will be described below.

On the surface of a p-type silicon substrate 1, a field oxide film 2 is formed by local oxidation of silicon (LOCOS) to define active regions. Next, a p-type well 3 and an n-type well 4 are formed by ion implantation and annealing for activation. The p- and n-type wells 3 and 4 are formed by implanting B and P ions, respectively, under the conditions of an acceleration energy of 200 keV and a dose of 1×10$^{13}$ cm$^{-2}$, and by performing annealing for activation in a nitrogen atmosphere for 3 hours at 1000° C.

Next, B ions are implanted in the region where the protection diode 20 is formed, in order to form the p-type region 18, under the conditions of an acceleration energy of 10 keV. Two types of samples were prepared at the doses of 1×10$^{14}$ cm$^{-2}$ and 5×10$^{13}$ cm$^{-2}$.

On the surface of the active regions, a gate oxide film of 10 nm thick is formed by thermal oxidation in 16 minutes at a temperature of 1000° C. This thermal oxidation process drives implanted B ions deep into the substrate. A polysilicon film of 200 nm thick is formed by chemical vapor deposition (CVD). A thorough oxide film of 5 nm thick is formed on the surface of the polysilicon film, and in order to make the gate electrode of n-type, P ions are implanted over the whole area of the polysilicon film under the conditions of an acceleration energy of 20 keV and a dose of 1×10$^{16}$ cm$^{-2}$. After P ions are implanted, the polysilicon film is patterned to form gate electrodes 7 and 10.

A thorough oxide film of 5 nm thick is formed on the surface of the active regions, and a resist pattern is formed which covers the region other than the n-channel MOS transistor forming region. By using this resist pattern and the gate electrode 7 as a mask, As ions for forming a lightly doped drain (LDD) structure are implanted under the conditions of an acceleration energy of 20 keV and a dose of 2×10$^3$ cm$^{-2}$. After this resist pattern is removed, another resist pattern is formed which covers the region other than the p-channel MOS transistor forming region. By using this resist pattern and the gate electrode 10 as a mask, BF$_2$$^+$ ions are implanted under the conditions of an acceleration energy of 20 keV and a dose of 1×10$^{13}$ cm$^{-2}$. Thereafter, the resist pattern is removed.

Next, an SiO$_2$ film of 100 nm thick is deposited over the whole surface of the substrate by CVD, and anisotropically etched by reactive ion etching (RIE) to form oxide side walls 19.

A through oxide film of 5 nm thick is formed, and a resist pattern is formed which covers the region other than those regions for forming n$^+$-type regions. By using this resist pattern and the gate structure as a mask, As ions are implanted under the conditions of an acceleration energy of 30 keV and a dose of 2×10$^{13}$ cm$^{-2}$ to form source/drain regions 5 and 6 of the n-channel MOS transistor, an n$^+$ region 13 of the protection diode 20, and a well contact region 12. Thereafter, the resist pattern is removed. Similarly, another resist pattern is formed and BF$_2$$^+$ ions are implanted under the conditions of an acceleration energy of 20 keV and a dose of 5×10$^{15}$ cm$^{-2}$ to form source/drain regions 9 and 8 of the p-channel MOS transistor and a well contact region 11.

Annealing for activation is performed in an N$_2$ atmosphere for 20 minutes at a temperature of 800° C. An interlevel insulating film and wirings 14, 15, 16, and 17 are formed.

Figure 9A:
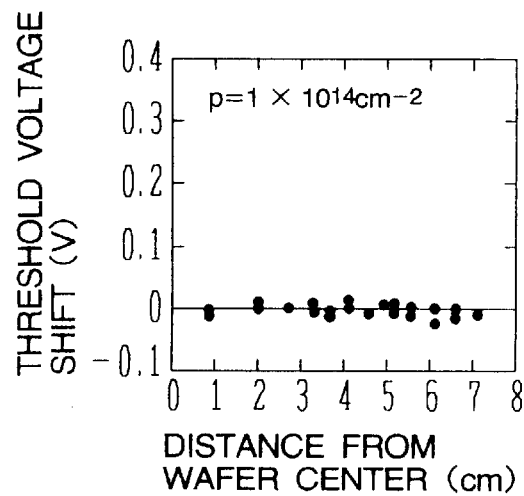
FIGS. 9A to 9C are graphs illustrating the relationship between a distance to a MOS transistor from a wafer center and a transistor threshold voltage shift, as measured for various impurity concentrations of a p-type region of a protection diode, with the reverse breakdown voltage of the protection diode being changed.
Figure 9B:
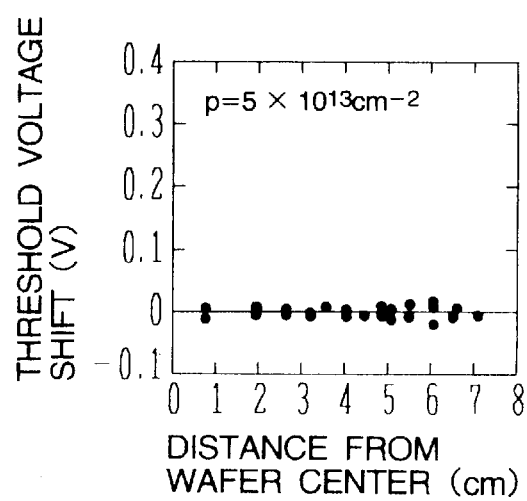
Figure 9C:
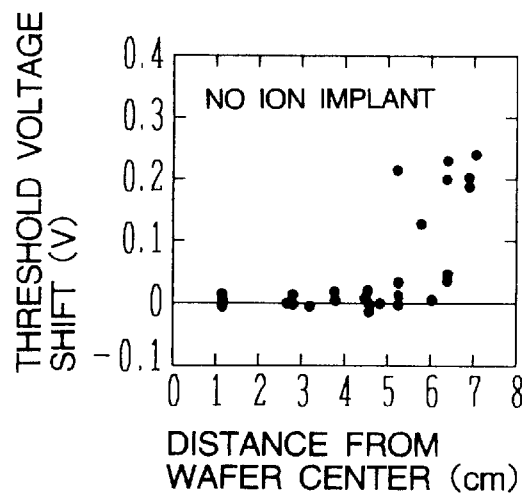

FIGS. 9A to 9C are graphs illustrating the effects of suppressing damage to a gate oxide film at various impurity concentrations of the p-type high impurity concentration region 18. In the case of FIG. 9A, B ions for forming the p-type high impurity concentration region 18 are implanted under the conditions of an acceleration energy of 10 keV and a dose of 1×10$^{14}$ cm$^{-2}$. In the case of FIG. 9B, B ions are implanted under the conditions of an acceleration energy of 10 keV and a dose of 5×10$^{13}$ cm$^{-2}$. In the case of FIG. 9C, the p-type high impurity concentration region 18 is not formed. The distance between the MOS transistor and the protection diode is about 300 µm and the antenna ratio is 4000.

As seen from FIGS. 9A and 9B, with the p-type high impurity concentration region 18 being formed, the threshold voltage shift is approximately 0 over the whole area of the wafer. In contrast, as seen from FIG. 9C, with no p-type high impurity concentration region 18 being formed, the threshold voltage shift becomes large in the peripheral area at a distance in excess of 5 cm from the wafer center, and some sample showed a shift over 0.2 V.

It can be understood from these results that lowering a reverse breakdown voltage of the protection diode is effective for suppressing damage to a gate oxide film. As shown in FIGS. 7A and 7B, if the distance between the protection diode and the MOS transistor is 100 gm or shorter, the threshold voltage shift is approximately 0 over the whole area of the wafer. Therefore, it is particularly effective for forming the p-type high impurity concentration region when the protection diode is located at a distance of 100 µm or longer from the MOS transistor.

At a high temperature of a wafer, reverse leak current probably flows through the protection diode at a considerably high level. Therefore, it can be judged that the protection diode provides a function of preventing the gate electrode from being charged during a high temperature process irrespective of whether its reverse breakdown voltage is large or small.

The suppression effects of damage to a gate oxide film are improved by lowering the reverse breakdown voltage of a protection diode. It may be considered from this fact that a potential distribution is generated in a wafer during a process at such a low temperature as the reverse breakdown voltage becomes meaningful, and that a high potential is transiently applied to the gate oxide film.

As described previously, it is preferable to implant ions for forming the p-type high impurity concentration region 18 before the gate oxide film is formed. By performing ion implantation prior to forming the gate oxide film, damage at the time of ion implantation can be recovered by the thermal treatment for the formation of the gate oxide film.

It is also preferable to implant impurities for the p-type high impurity concentration region 18 shallower than impurities for the $n^+$-type region 13. Even if ion implantation is shallow, the impurities for the p-type high impurity concentration region 18 undergo the thermal treatment for the formation of the gate oxide film, and diffuse deeper than the impurities for the $n^+$-type region 13. Therefore, the p-type high impurity concentration region 18 is formed between the $n^+$-type region 13 and the p-type well 3.

When ions are implanted, crystal defects are likely to be generated at the region slightly shallower than the depth of ion implantation. By implanting ions for the p-type high impurity concentration region 18 slightly shallower than ions for the $n^+$-type region 13 and diffusing the ions for the p-type high impurity concentration region 18 at the thermal treatment, it becomes possible to suppress the formation of crystal defects at the p-n junction of the protection diode 20.

Leak current can therefore be reduced by suppressing the formation of crystal defects at the p-n junction by ion implantation and by recovering good crystallinity by the thermal treatment after ion implantation. Furthermore, since the impurity concentration is raised only at the p-n junction region, it is possible to keep the impurity concentration of the most area of the well at a desired level.

It is preferable to form the protection diode 20 having the p-type high impurity concentration region at a location as remote as possible from the MOS transistor in the same well. By forming the protection diode 20 at the remote location, it is possible to prevent an increase of the impurity concentration in the well to be otherwise caused by the ion implantation for the diode and to suppress a change in the threshold voltage of the MOS transistor. More specifically, it is preferable to form the MOS transistor at a location spaced by a longer distance from the protection diode than the case of employing a protection diode without the p-type high impurity concentration region.

Next, with reference to FIG. 10 and FIGS. 11A to 11E, the relationship between the position of a protection diode connected to a long and wide area wiring and the damage suppression effects of a gate oxide film will be described.

Figure 10:
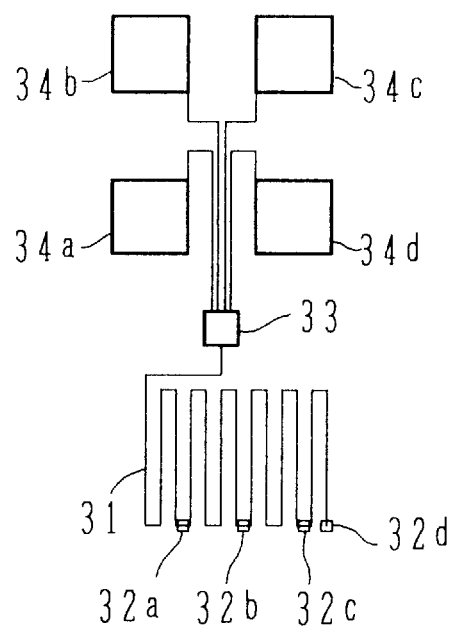
FIG. 10 is a plan view showing the position of a protection diode connected to a long and wide area wiring at different positions.

FIG. 10 is a schematic diagram illustrating a position of a protection diode. Test elements were prepared having protection diodes at positions at ratios (hereinafter called an interior division ratio) of about 0:1, 1:3, 1:1, 3:1, and 1:0. The interior division ration is a ratio of a length of the long and wide area wiring 31 between the gate electrode and the protection diode to a length thereof from the protection diode to the isolated distal end of the wiring 31. The structure of the test element with the interior division ratio of about 0:1 is similar to that shown in FIGS. 3B and 3C.

The protection diodes 32a, 32b, 32c, and 32d shown in FIG. 10 have the interior division ratios of about 1:3, 1:1, 3:1, and 1:0. Even with different interior division ratios, the rectilinear distance between the MOS transistor and the protection diode was set generally constant. The antenna ratio was 4000 for all the interior division ratios.

FIGS. 11A to 11E illustrate the threshold voltage shift for the interior division ratios (IDR) of about 0:1, 1:3, 1:1 3:1, and 1:0.

Figure 11A:
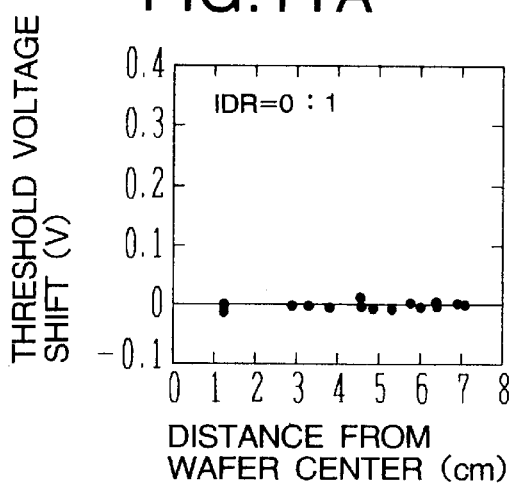
FIGS. 11A to 11E are graphs illustrating the relationship between a distance to a MOS transistor from a wafer center and a transistor threshold voltage shift, as measured for various positions of a protection diode connected to a long and wide area wiring.
Figure 11B:
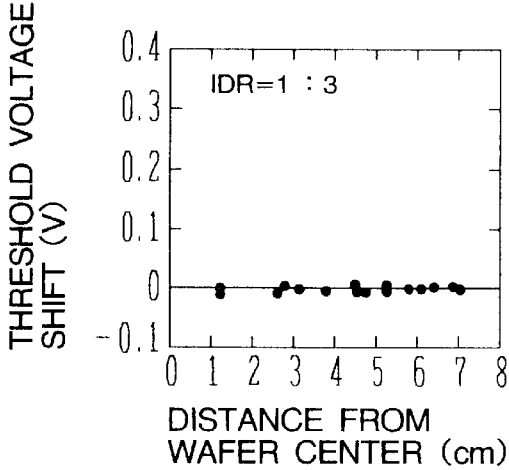
Figure 11C:
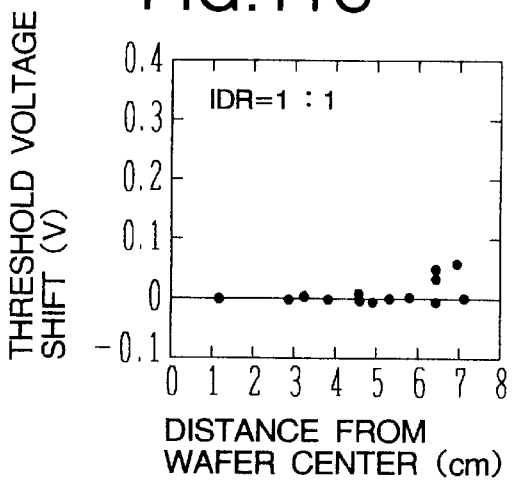

As shown in FIGS. 11A and 11B for the interior ratios of about 0:1 and 1:3, the threshold voltage shift is approximately 0 over the whole area of the wafer. As shown in FIG. 11C for the interior division ratio of about 1:1, the threshold voltage shift becomes slightly large, about 0.05 V, in the peripheral area at the distance of 6 cm or longer from the wafer center.

Figure 11D:
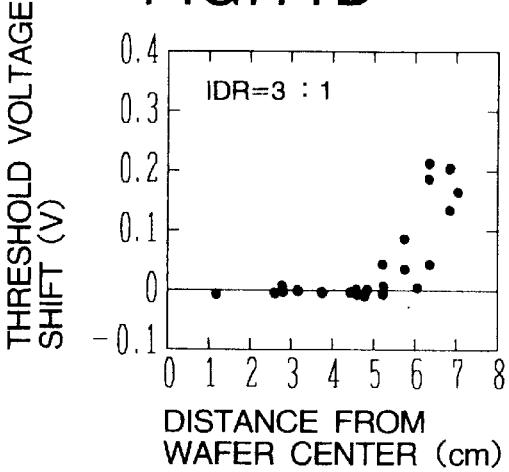

As shown in FIG. 11D for the interior division ratio of about 3:1, the threshold voltage shift becomes larger in the peripheral area at the distance of 5 cm or longer from the wafer center, and some sample showed about 0.2 V in the peripheral area at the distance of 6 to 7 cm from the wafer center.

Figure 11E:
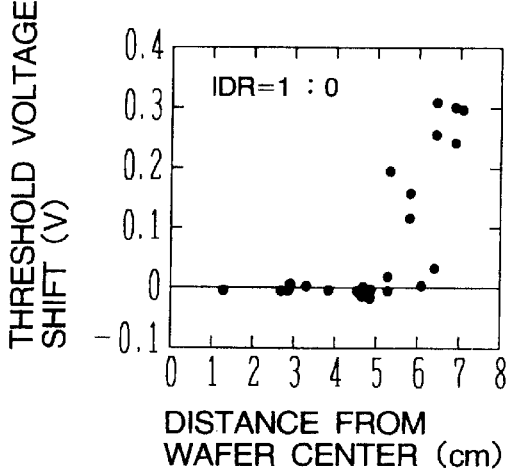
Figure 12A:
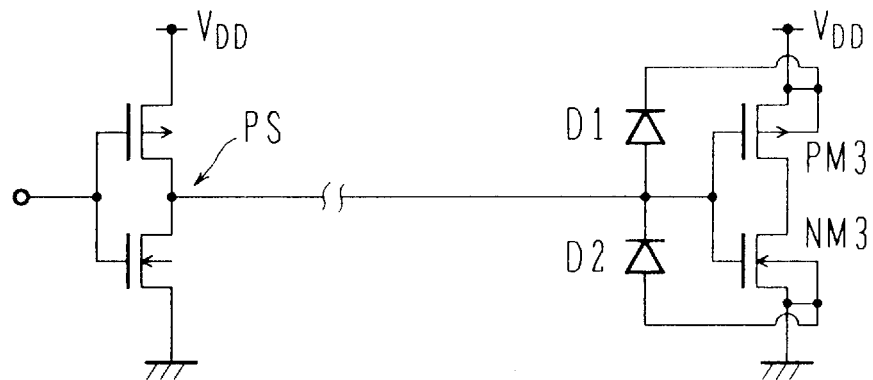
FIGS. 12A and 12B are a circuit diagram of a conventional CMOS circuit with protection diodes connected thereto and a circuit diagram of a NAND gate of a CMOS type.
Figure 12B:
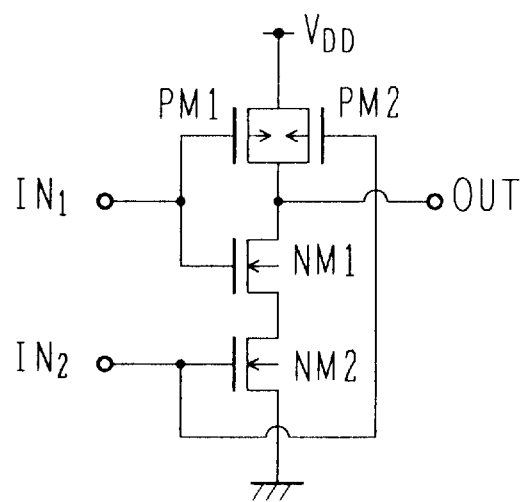

As shown in FIG. 11E for the interior division ratio of about 1:0, the threshold voltage shift becomes much larger in the peripheral area at the distance of 5 cm or longer from the wafer center, and some sample showed about 0.3 V.

As seen from the graphs of FIGS. 11A to 11F, the length of the long and wide area wiring between the gate electrode and the protection diode is preferably made as short as possible. The protection diode is preferably disposed on the side of the gate electrode from the middle point of the long and wide area wiring.

Even a very small area of the protection diode could provide the damage suppression effects of the gate oxide film. Even an area formed by a minimum design rule provided the damage suppression effects sufficiently. In order to efficiently use the area of a wafer, it is preferable to give a smallest available area to the protection diode among the active regions on a wafer surrounded by the field oxide film.

In the above embodiments, the protection diode and the n-channel MOS transistor are formed in a p-type well in a p-type substrate. They may be formed directly in the surface of a p-type substrate without forming a p-type well. The conductivity type of all the element regions may be reversed. Also in this case, it is obvious to those skilled in the art that similar advantageous effects as above can be expected.

It was found from the above experiments that damage to a gate oxide film was able to be suppressed. A plurality of chips were formed in a semiconductor wafer, and test elements satisfying the above conditions were fabricated and experiments were conducted. However, it was found from these experiments that some test elements still showed damaged gate oxide films.

Figure 13A:
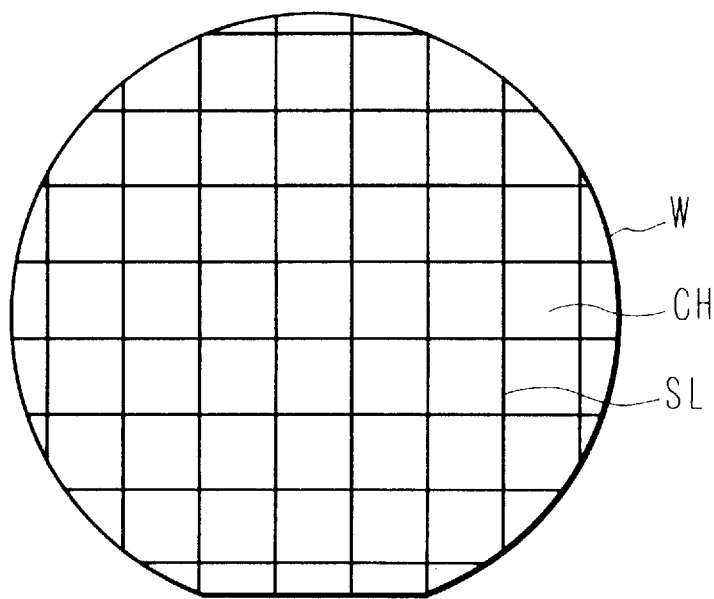
FIGS. 13A and 13B are plan views illustrating the structure of test samples.

FIG. 13A is a schematic plan view of a semiconductor wafer in which a plurality of chips W are formed in a matrix shape. Each adjacent or juxtaposed chips are separated by a scribe line SL. Each semiconductor chip CH was formed with other kinds of elements and the gate oxide film damage suppression structure, and experiments were conducted. Although the test elements satisfied the above conditions, it was found that some gate oxide films were damaged.

Figure 13B:
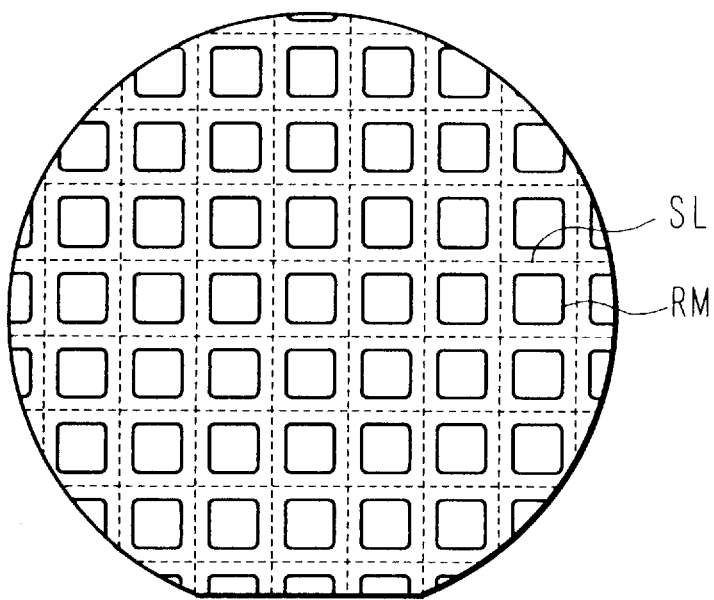

As shown in FIG. 13B, damages of gate oxide films did not occur when all the scribe lines SL of the wafer were covered with a resist mask RM.

The inventor reasons out this phenomenon as in the following.

Figure 14A:
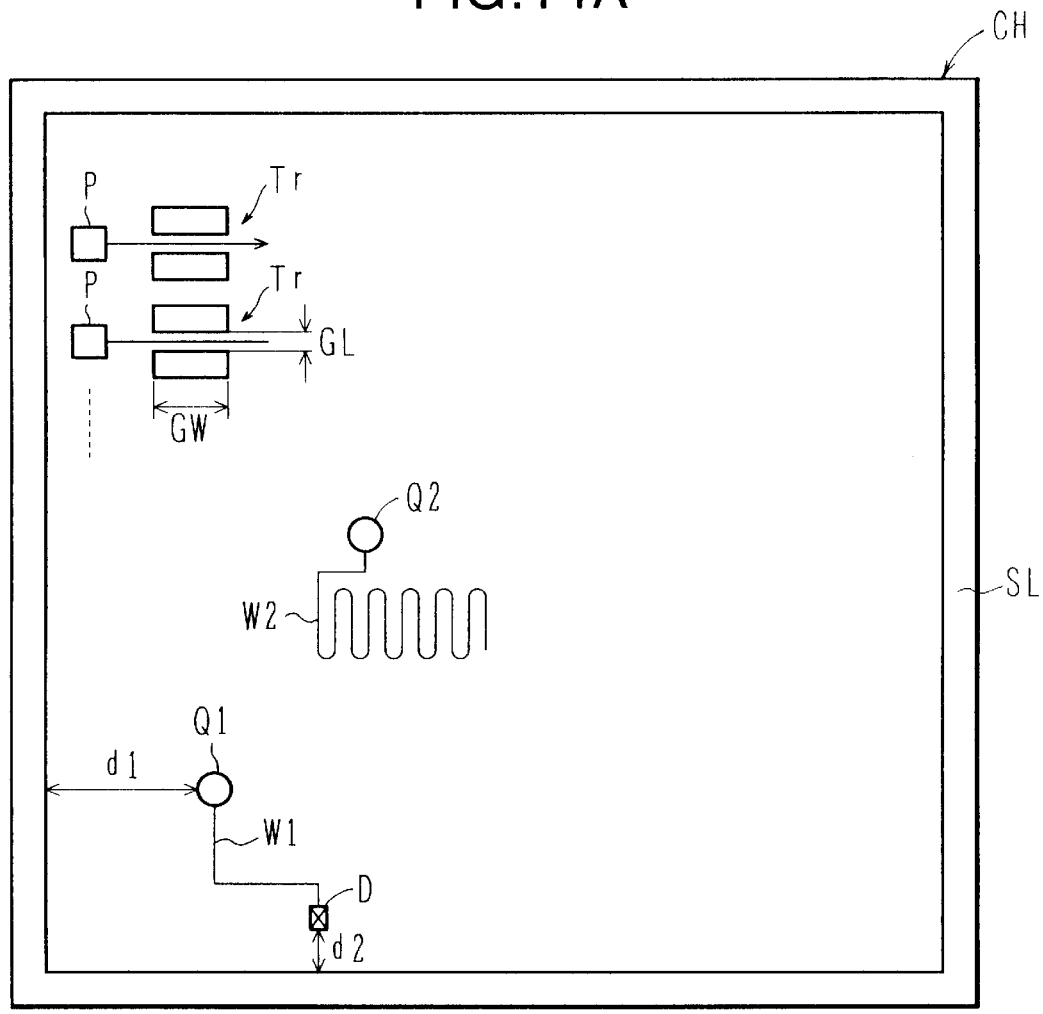
FIGS. 14A and 14B are a plan view and a cross sectional view illustrating the structure of a chip.

FIG. 14A is a schematic diagram showing one semiconductor chip. The peripheral area of the semiconductor chip CH is a scribe line SL. The semiconductor surface is exposed at this scribe line SL generally during all processes.

If there is an aperture of a large aspect ratio in an insulating layer, positive charges may be injected through the aperture into the substrate via a MOS capacitor structure or a diffusion region during a plasma process. Since the scribe line is wide and is exposed to plasma, both positive and negative charges enter the substrate. Even if the substrate is charged positive, charges may be neutralized in the scribe line. From another viewpoint, current may flow from an internal region to the scribe line in each chip. Current flowing in the substrate generates a potential distribution in the substrate. This potential distribution may be one of the reasons of gate oxide film damage. If the scribe line is completely covered with an insulating film such as a resist film, the substrate current becomes hard to flow. As a result, the potential distribution becomes difficult to be generated in the substrate, and damage of a gate oxide film is likely to be suppressed.

A variety of semiconductor device elements are formed in the inner region surrounded by the scribe line SL. Input/output pads P are connected via input/output protection transistors Tr to the internal circuit. The internal circuit includes a MOS transistor Q2 having a gate electrode connected to a long and wide area wiring W2. In another region of the semiconductor chip, a MOS transistor Q1 is formed, and a wiring W1 connects the gate of the MOS transistor Q1 to a diffusion region D such as a drain of another transistor. A distance between the MOS transistor Q1 and the scribe line SL is represented by d1, and a distance between the diffusion region D and the scribe line SL is represented by d2.

Charges accumulated on the long and wide area wiring W2 enter the substrate of the semiconductor chip CH via the gate insulating film of the transistor Q2 or via a diffusion region connected to the wring W2. As this current flows in the semiconductor substrate, a potential distribution is generated in the substrate. If the intra-substrate potential under the MOS transistor Q1 differs largely from that of the diffusion region D, a large voltage is applied across the gate insulating film of the MOS transistor Q1. The intra-substrate potential distribution is probably dependent upon the distance to the scribe line.

Figure 14B:
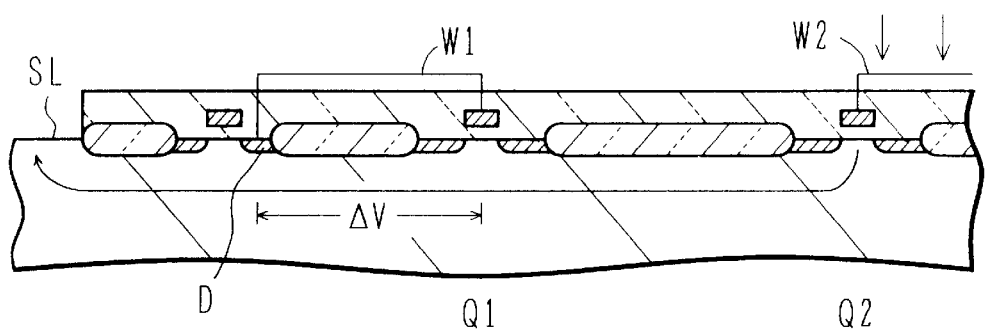

FIG. 14B is a schematic cross sectional view of the semiconductor chip shown in FIG. 14A. A MOS transistor having the diffusion region D is shown in the left side of FIG. 14B, the MOS transistor Q1 is shown in the center of FIG. 14B, and the wiring W1 interconnects the diffusion region D and the gate of the MOS transistor Q1. The MOS transistor Q2 with its gate electrode connected to the long and wide area wiring W2 is shown in the right side of FIG. 14B. As electric charges enter from the long and wide area wiring W2 to the gate oxide film and to the substrate, current flows in the substrate in a lateral direction.

Since the surface of the scribe line SL is exposed, this surface becomes an output port of current. More specifically, if plasma containing positive and negative charges are in contact with the surface of the scribe line SL, positive charges flowed in the substrate and reached the surface of the scribe line SL are combined with negative charges and are neutralized.

In the internal region surrounded by the scribe line SL, excessive positive charges are incident upon a window having a high aspect ratio and enter the substrate. These positive charges become current flowing in the substrate so that a potential distribution is formed in the substrate in the lateral direction. In the structure shown in FIGS. 14A and 14B, as an intra-substrate potential distribution ΔV is generated between the channel region just below the gate electrode of the MOS transistor Q1 and the diffusion region D (which is connected to the gate electrode so that the potential of the diffusion region directly becomes the potential of the gate electrode of the MOS transistor Q1), a voltage ΔV is applied across the gate insulating film of the MOS transistor Q1. It is to be noted that even electric charges collected by the wiring W1 are small, the intra-substrate potential distribution may deteriorate the gate insulating film. The generated voltage ΔV is possibly dependent upon a difference between the distances d1 and d2.

Figure 15A:
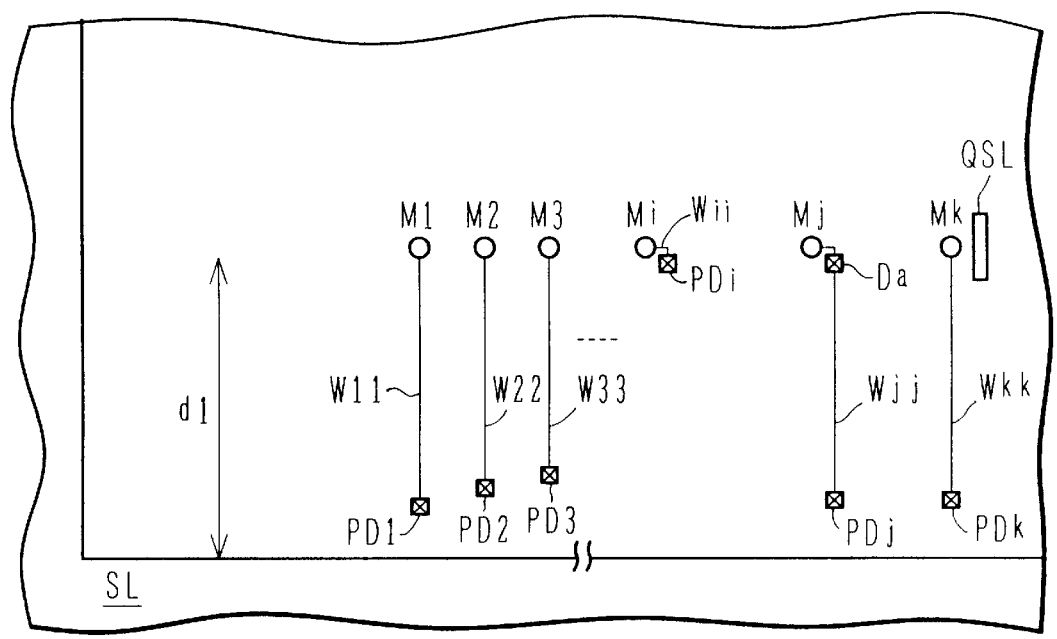
FIGS. 15A and 15B are a graph showing experiment results and plan view of a sample used by the experiments.
Figure 15B:
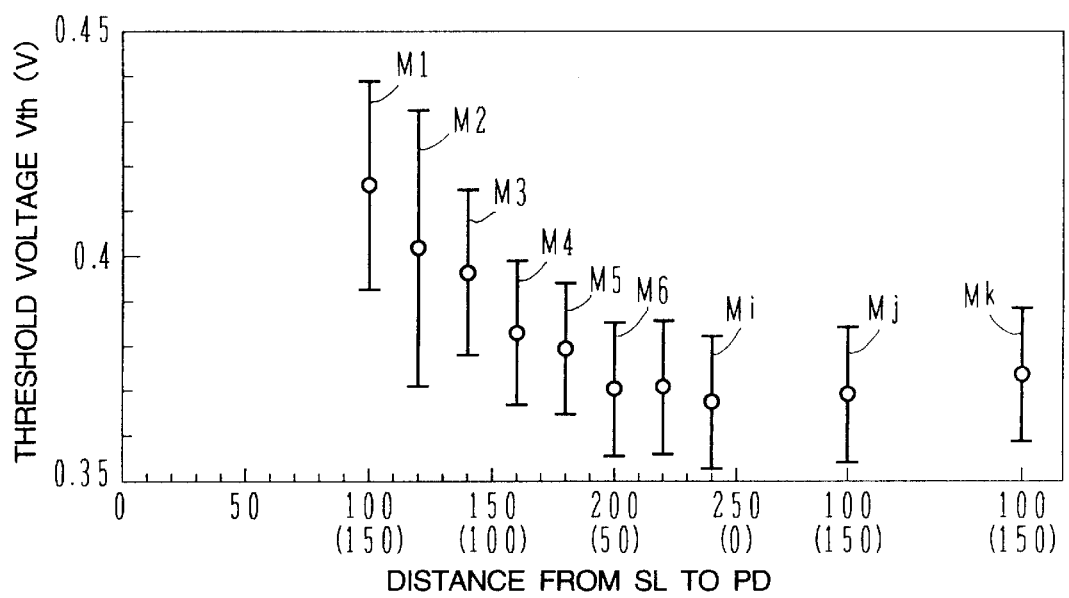

FIGS. 15A and 15B are diagrams used for the explanation of experiments made for confirming the above-described reasoning.

FIG. 15A is a schematic plan view showing the structure of an experiment sample. A plurality of MOS transistors M1, M2, . . . , Mk are formed at a constant distance d1, in this sample at a distance of 250 μm, from the scribe line SL. Protection diodes PD1 to PDi are formed at distances of 100, 120, 140, . . . 240μm from the scribe line SL. Pairs of a MOS transistor and a protection diode are connected by wirings W11 to Wii.

For a MOS transistor Mj, a protection diode PDj is formed at a distance of 100 μm from the scribe line SL, the insulating gate and the protection diode PDj are connected by a wiring Wjj, and another protection diode Da is connected to the wiring Wjj at a distance of about 10 μm from the gate electrode of the MOS transistor Mj.

For a MOS transistor Mk, a protection diode PDk is formed at a distance of 100 μm from the scribe line SL, and the gate electrode of Mk and the protection diode PDk are connected by a wiring Wkk. A quasi scribe line QSL with the exposed substrate surface is formed near the MOS transistor Mk.

This sample was subjected to a plasma process and damage formed in the gate oxide film of each MOS transistor M was measured.

FIG. 15B is a graph showing threshold voltages Vth of the MOS transistors M1 to Mk of the sample shown in FIG. 15A. The abscissa represents a distance of the protection diode PD from the scribe line SL in units of μm. Values entered between parentheses indicate the distance between the MOS transistor and protection diode. The ordinate represents a threshold voltage in units of V.

Two plots shown in the right side of FIG. 15B indicate the measured threshold voltage values of the test devices Mj and Mk. The test device Mj has the protection diode at a distance of 100 μm from the scribe line SL and the other protection diode Da at a distance of 10 μm from the insulated gate electrode. The test device Mk has the protection diode at a distance of 100 μm from the scribe line SL and a quasi scribe line QSL near the insulated gate electrode.

As seen from the graph of FIG. 15B, the threshold voltage of the MOS transistor becomes high as the distance between the protection diode and the MOS transistor becomes long. Particularly, as the distance between the protection diode and the gate electrodes of the eOS transistor becomes 70 μm or longer, a change in the threshold voltage becomes prominent.

Even if the protection diode is formed remote from the MOS transistor, the threshold voltage change becomes small if another protection diode is formed near the MOS transistor, as seen from the measured result of the test device Mj. As seen from the measured results of the test devices M1 and Mk, the threshold voltage change becomes considerably small if the quasi scribe line QSL is formed near the MOS transistor.

As shown in FIG. 14A, a plurality of input/output protection transistors Tr are generally formed in a semiconductor chip. The size of this protection transistor Tr is designed larger than other transistors. LSI designs are so made that an intra-substrate potential distribution is not formed in the region having a length equal to a longer length of either a gate length GL or a gate width GW of the protection transistor Tr, usually the longer length being the gate width GW. Therefore, the intra-substrate potential distribution may be considered as negligible within a distance in the range of a largest size of transistors in a semiconductor chip. For example, if the gate length GL is 0.5 µm and the gate width GW is 50 µm, the intra-substrate potential distribution is negligible within a distance of the gate width of 50 µm.

The experiment results shown in FIG. 15 support this concept. Namely, the threshold voltage change is of a negligible order for the samples having a distance equal to or shorter than 50 µm between the MOS transistor and the protection diode.

In a semiconductor chip such as shown in FIG. 14A, distribution of MOS transistors Q2 with the long and wide area wiring W2 in the chip is not uniform. In this case, however, if a plurality of MOS transistors with the long and wide area wiring are formed in a semiconductor chip, it can be considered that intra-substrate current flows from an approximately central area of the chip to the scribe line.

Therefore, the positional relationship between the MOS transistor and the protection diode can be determined based upon the distance from the scribe line SL. Specifically, if the distances from the scribe line SL are equal, the intra-substrate potential at these positions can be considered nearly equal. Therefore, it is sufficient if the MOS transistor Q and the protection diode PD connected to the wiring are disposed at the same distance from the scribe line SL.

Since a potential drop in the semiconductor substrate is almost negligible if the distance is within the gate width of a largest size transistor, it is sufficient if a difference between the distance of the insulated gate electrode of a MOS transistor from the scribe line and the distance of the protection diode connected to the wiring from the scribed line is equal to, or smaller than, the gate width of the largest size transistor in the chip.

A wiring connected to a gate electrode is often connected to the drain region of another MOS transistor. In such a case, the drain region can function as a protection element. Therefore, the protection diode may be replaced by a diffusion region, e.g. the drain region. These drain regions and protection diode are collectively called a diffusion region.

Figure 16:
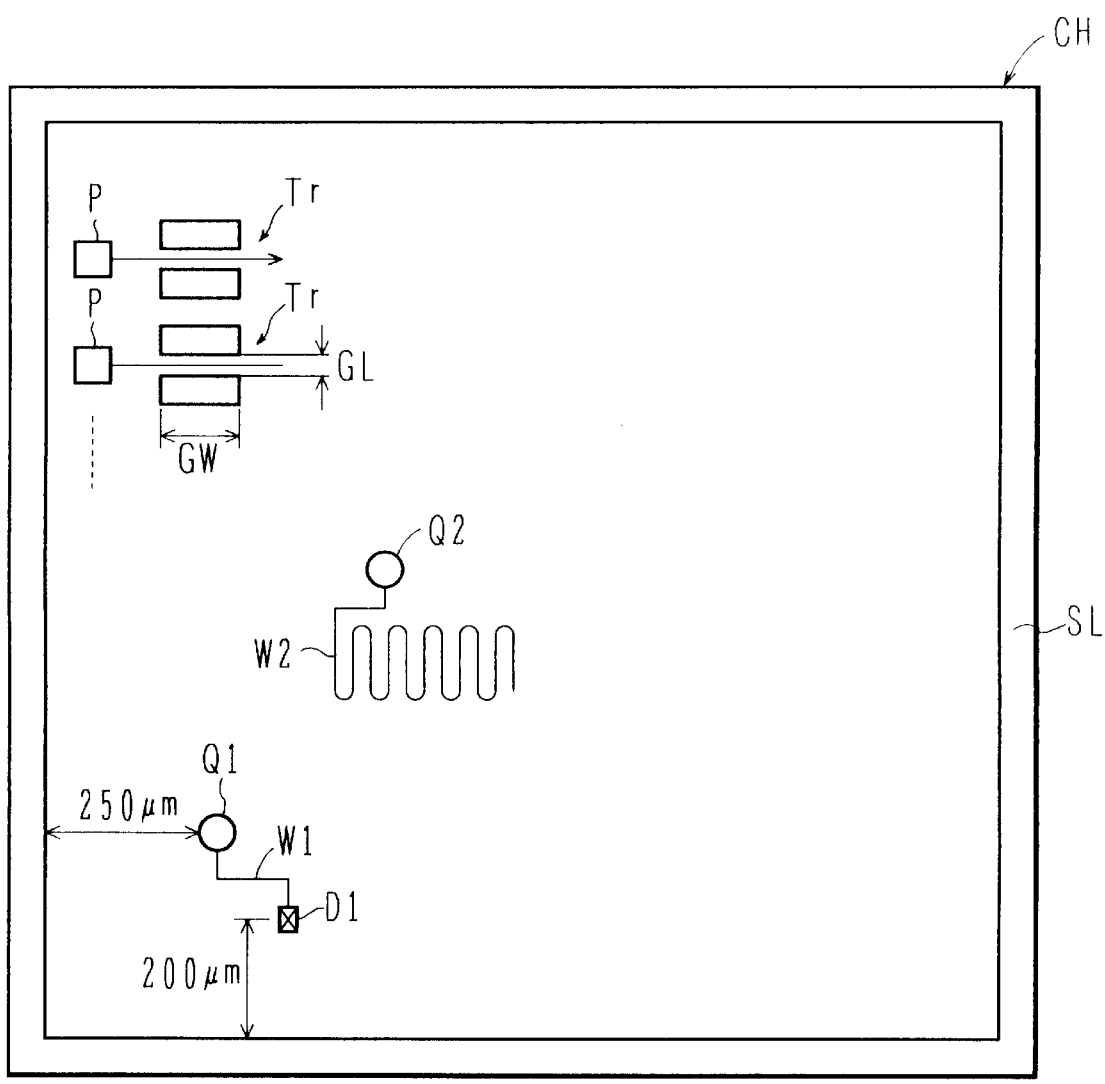
FIG. 16 is a plan view showing the structure of a chip according to embodiment of the invention.

FIG. 16 is a schematic diagram showing an example of the structure of a semiconductor chip. In the semiconductor chip CH, a MOS transistor Q1 and a drain diffusion region D1 of another MOS transistor are disposed.

The gate electrode of the MOS transistor Q1 is formed at a distance of 250 µm from the scribe line SL. The drain diffusion region of the other MOS transistor is formed at a distance of 200 µm from the scribe line SL. Both the gate electrode and the drain diffusion region are connected by a wiring W1.

In this case, there is a difference of only 50 µm between the distance of 250 µm of the gate electrode of the MOS transistor Q1 from the scribe line SL and the distance of 200 µm of the drain diffusion region D1 from the scribe line SL. Assuming that the gate width of a largest size transistor in this chip is 50 µm similar to the above, it may be considered that the intra-substrate potential of the drain diffusion region D1 and the potential of the channel region of the MOS transistor Q1 are nearly equal. Therefore, damage to the gate insulating film of the MOS transistor Q1 is not likely to occur.

Figure 17:
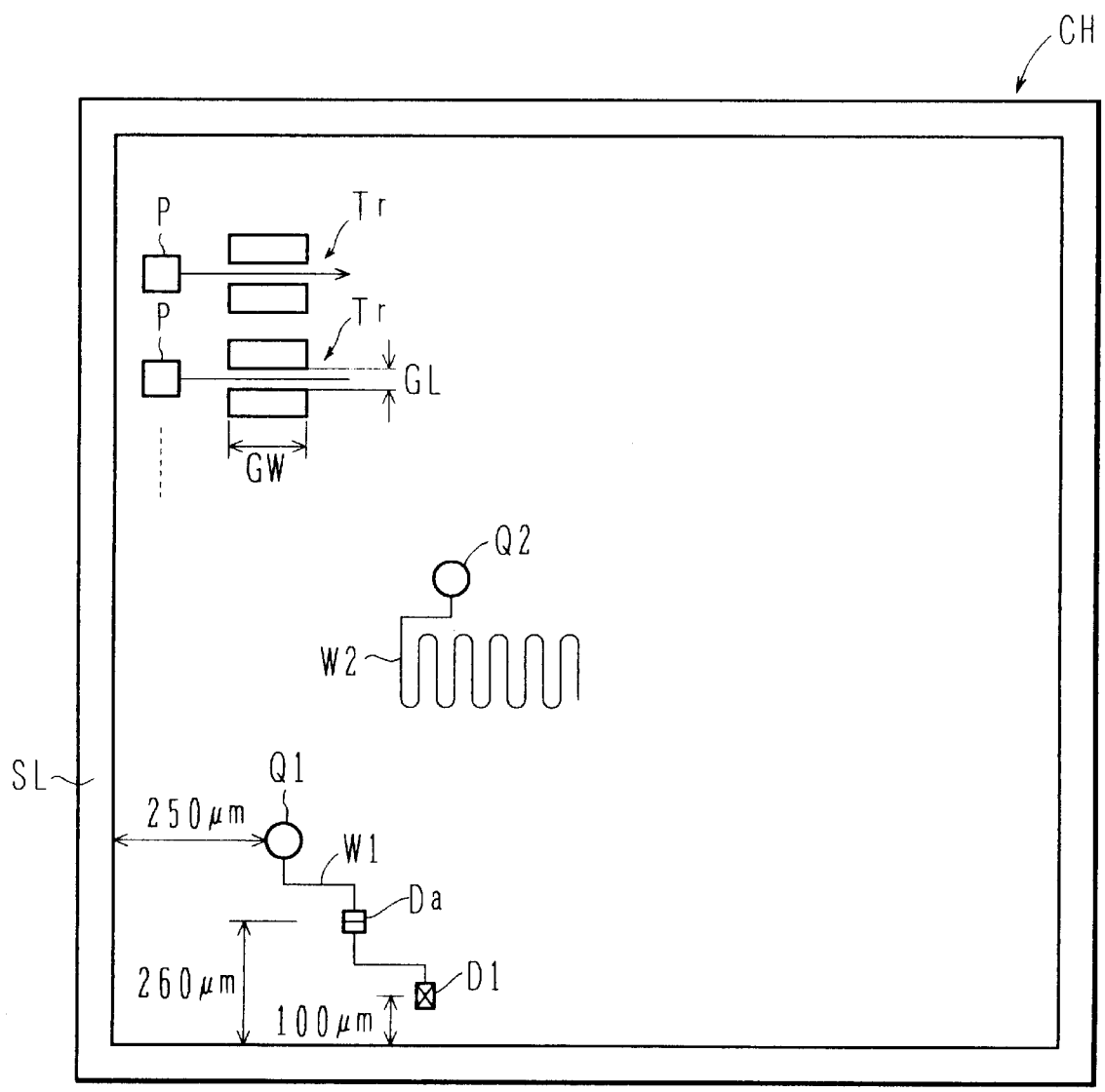
FIG. 17 is a plan view showing the structure of a chip according to another embodiment of the invention.

FIG. 17 is a schematic diagram showing another example of the structure of a semiconductor chip. In the semiconductor chip CH, a MOS transistor Q1 and a drain diffusion region D1 of another MOS transistor are disposed. Both the gate electrode and the drain diffusion region are connected by a wiring W. The MOS transistor Q1 is formed at a distance of 250 µm from the scribe line SL. The drain diffusion region D1 is formed at a distance of 100 µm from the scribe line SL.

In this case, a difference between the distances of both the MOS transistor Q1 and the drain diffusion region D1 is 250−100=150 µm which is greatly longer than the gate width of 50 µm of the largest size transistor in the chip. With this chip structure, the threshold voltage is likely to change greatly as the case of the MOS transistor M1 shown in FIG. 15B.

It is therefore preferable to form another protection diode Da at an intermediate position of the wiring W. The protection diode Da is connected to the wiring W, for example, at a distance of 260 µm from the scribe line SL.

With this structure, a voltage applied to the gate electrode of the MOS transistor Q1 is approximately equal to the intra-substrate potential of the protection diode Da. Therefore, a large voltage is prevented from being applied to the gate insulating film. Although a large potential difference may be generated between the drain diffusion layer D1 and the protection diode Da, this potential difference can be compensated for by a current flowing between the drain diffusion layer D1 and the protection diode Da.

Intra-substrate current flows when positive charges are accumulated by plasma on the long and wide area wiring W2. Therefore, in a semiconductor integrated circuit with a long and wide area wiring, it is effective to adjust the positional relation between the MOS transistor and the protection diffusion region disposed in the chip, in the manner described above.

An intra-substrate potential distribution is generated when charges entered the substrate at an internal region of a semiconductor chip flow toward the scribe line. If the potential at the scribe line is used as a reference potential, resistance to the scribe line becomes high and a generated potential difference becomes large as the distance to the scribe line is made long.

If there is a region at which charges in plasma directly couple with charges in the substrate, like the scribe line, in the inner region surrounded by the scribe line, the potential at such a region possibly becomes equal to that at the scribe line. Such a region is called a quasi scribe line as described earlier. If quasi scribe lines are distributively formed in the inner region surrounded by the scribe line and a distance between each MOS transistor and the scribe line or quasi scribe line is made short, a potential difference in the substrate becomes small and damage to the gate oxide film is possibly reduced.

The test element Mk shown in FIGS. 15A and 15B was formed on the basis of this concept. It is provided with the quasi scribe line QSL near the MOS transistor. Provision of the quasi scribe line considerably reduces a change in the threshold voltage, as compared to the test element M1 having similar other conditions.

Such a quasi scribe line may be a wiring layer electrically exposing the upper surface of a semiconductor substrate when each wiring layer forming process is performed. The semiconductor surface may be directly exposed to form a quasi scribe line, a conductive layer such as metal formed on the semiconductor surface may alternatively be exposed, or a conductive layer on the semiconductor surface together with adjacent semiconductor surface may be exposed. In the process of forming a cover film after the uppermost wiring layer is formed, the quasi scribe line may be covered with the cover film.

Figure 18A:
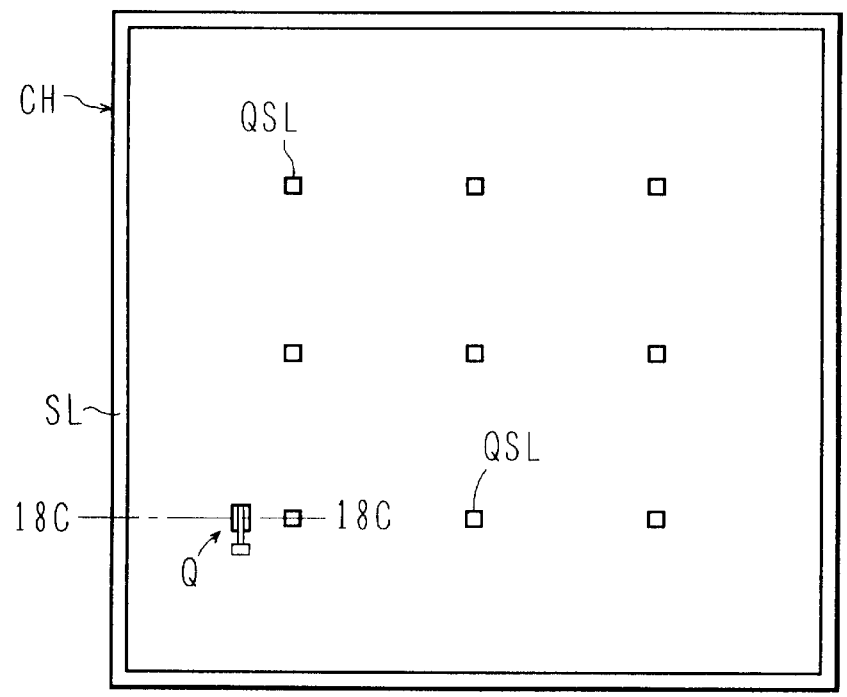
FIGS. 18A to 18C are plan views and a cross sectional view showing the structure of a chip according to another embodiment.
Figure 18B:
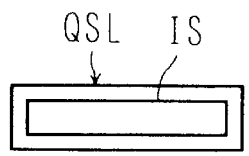
Figure 18C:
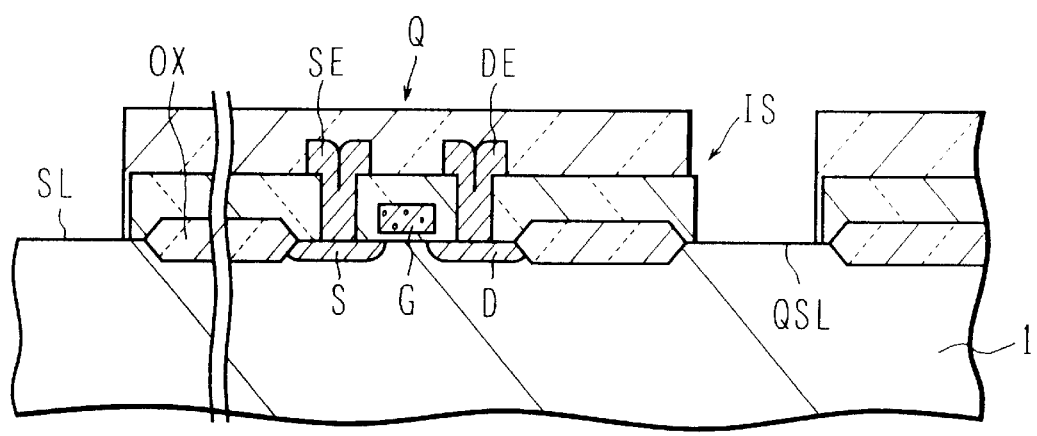

FIGS. 18A to 18C show the structure of a semiconductor chip having quasi scribe lines. FIG. 18A is a plan view of the semiconductor chip, FIG. 18B is an enlarged plan view of one quasi scribe line, and FIG. 18C is a cross sectional view taken along a chain line 18C—18C shown in FIG. 18A.

Referring to FIG. 18A, a semiconductor chip CH has a scribe line SL at its periphery and a plurality of quasi scribe lines QSL distributively formed in the inner region surrounded by the scribe line SL. A number of MOS transistors in conformity with circuit designs are formed in the inner region.

As shown in FIG. 18B, each quasi scribe line is rectangular. In this example shown in FIG. 18B, its size is 10 $\mu$m×60 $\mu$m. Even after the upper structure is formed, a semiconductor surface of about 8 $\mu$m×50 $\mu$m is exposed in an insulating structure IS. These sizes are only explanatory and can be changed as desired depending upon circuit designs or the like. The shape of the quasi scribe line can also be changed as desired.

Following experiments were done for clarifying what conditions are necessary for a quasi scribe line to make good electrical contact with a plasma generated thereabove.

Figure 23A:
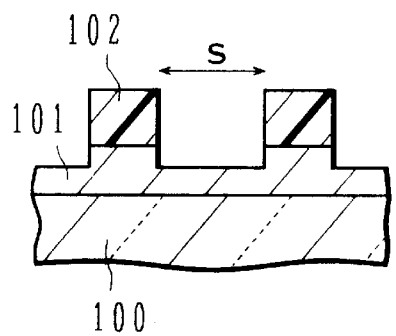
FIGS. 23A to 23C are a cross sectional view and graphs illustrating the results of experiments.

FIG. 23A shows a cross sectional structure of a sample. A metal layer 101 of a thickness 0.5 $\mu$m is formed on a thick insulating film 100, and a resist pattern 102 of a thickness 0.5 $\mu$m is formed thereon. The metal layer 101 is connected to an insulated gate electrode of an n- or p-channel MOS transistor. The resist pattern 102 has a strip shape of a width 0.5 $\mu$m. The space s between adjacent patterns 102 is changed. The metal layer 101 was etched by using these resist patterns 102 as an etching mask. Upon completion of the etching, an aperture having a width s and a height 1 $\mu$m is formed between resist patterns.

If an unbalanced positive or negative charge is injected to the metal layer 101 during etching, the threshold voltage of the MOS transistor will change. Various samples of n- and p-channel MOS transistors having various space width s were measured.

Figure 23B:
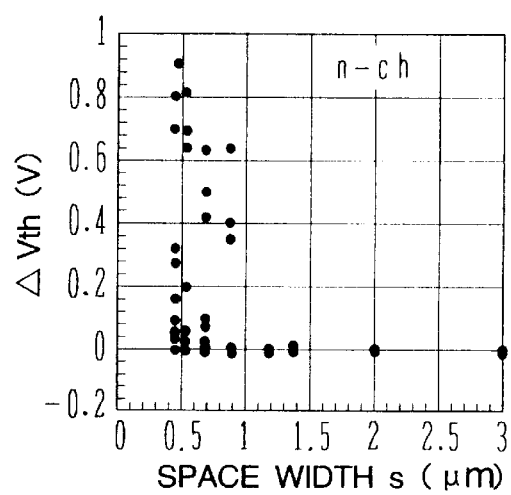

FIG. 23B shows the experimental results on n-channel MOS transistors. Samples having a space width s equal to or more than 1.2 $\mu$m showed almost no change in the threshold voltage, but samples having a space width s equal to or less than 0.9 $\mu$m showed largely decreased threshold voltage.

Figure 23C:
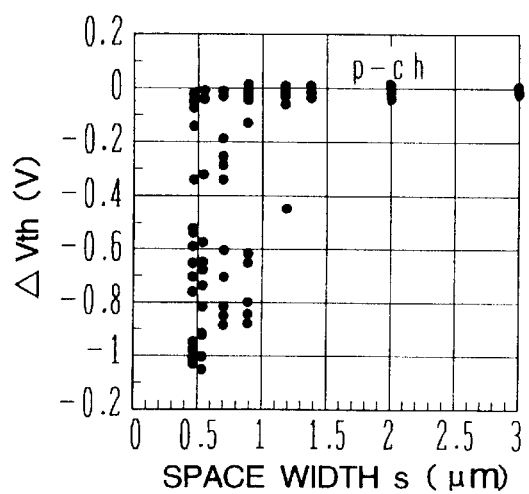

FIG. 23C shows experimental results on p-channel MOS transistors. Samples having a space width s equal to or more than 1.4 $\mu$m showed almost no change in the threshold voltage, but samples having a space width s equal to or less than 1.2 $\mu$m showed largely decreased threshold voltage.

Considering the aspect ratio of an aperture at the completion of etching, it can be concluded that the change in the threshold voltage is negligible if the aspect ratio of a space, i.e. quasi scribe line, is equal to or less than 1/1.2 for the case of n-channel MOS transistor, and is equal to or less than 1/1.4 for the case of p-channel MOS transistor. Thus, if a quasi scribe line has an aspect ratio equal to or less than 1/1.4, it will be possible to make good electrical contact between the quasi scribe line (i.e. substrate), and the plasma.

When considering only the resist pattern, the aspect ration of a quasi scribe line is preferably equal to or less than 1/2.8.

When only the width of the quasi scribe line is considered, the width is preferably equal to or more than 1.4 $\mu$m. Also, the width of a quasi scribe line preferably has a width four or more times the thickness of a wiring layer. This is because, during etching of a wiring pattern, the scribe line (i.e.) (the wiring layer) should not be shielded by a resist pattern from the positive and negative charges in plasma.

FIG. 18C shows the cross sectional structure taken along the chain line 18C—18C shown in FIG. 18A. A field oxide film OX is selectively formed on the surface of a silicon semiconductor substrate 1. At the peripheral area of the chip, the field oxide film OX is not formed and the semiconductor surface is exposed to form the scribe line SL. The surface of the semiconductor substrate 1 is also exposed at each quasi scribe line QSL.

Other apertures defined by the field oxide film OX are active regions in which device elements are formed. In the example shown in FIG. 18C, a MOS transistor Q is formed in an active region. The MOS transistor Q has a source region S and a drain region D formed in the semiconductor substrate 1 and an insulated gate electrode G formed over the channel region between the source and drain regions.

Source and drain electrodes SE and DE are connected to the source and drain regions S and D, respectively. An insulating film IS covering the gate electrode G, source electrode SE, and drain electrode DE is not formed at the area of the quasi scribe line QSL to expose the semiconductor surface. The insulating film IS is made of, for example, phosphosilicate glass (PSG).

Figure 19:
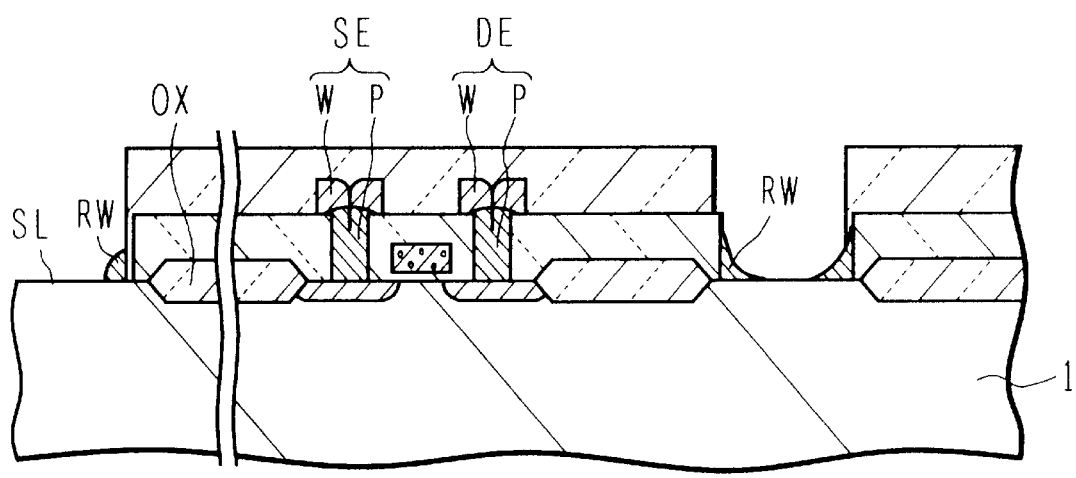
FIG. 19 is a cross sectional view showing the structure of a chip according to another embodiment.

FIG. 19 is a cross sectional view showing another example of a semiconductor structure. In FIG. 19, like elements to those shown in FIG. 18C are represented by identical reference numerals. In the example of this structure, the source electrode SE and the drain electrode DE of a MOS transistor Q are each made of an embedded metal region P such as a tungsten plug and a wiring layer W formed on the surface of the embedded metal region P. The tungsten plug P is formed by first forming a contact hole, thereafter depositing a conformal tungsten layer over the whole surface of the substrate, and etching back the conformal tungsten layer. In these tungsten deposition process and etch-back process, the tungsten layer is deposited and etched back also in the region of a scribe line SL and a quasi scribe line QSL. On the substantially vertical side wall of an insulating film, a tungsten region RW not etched back is left.

Figure 20A:
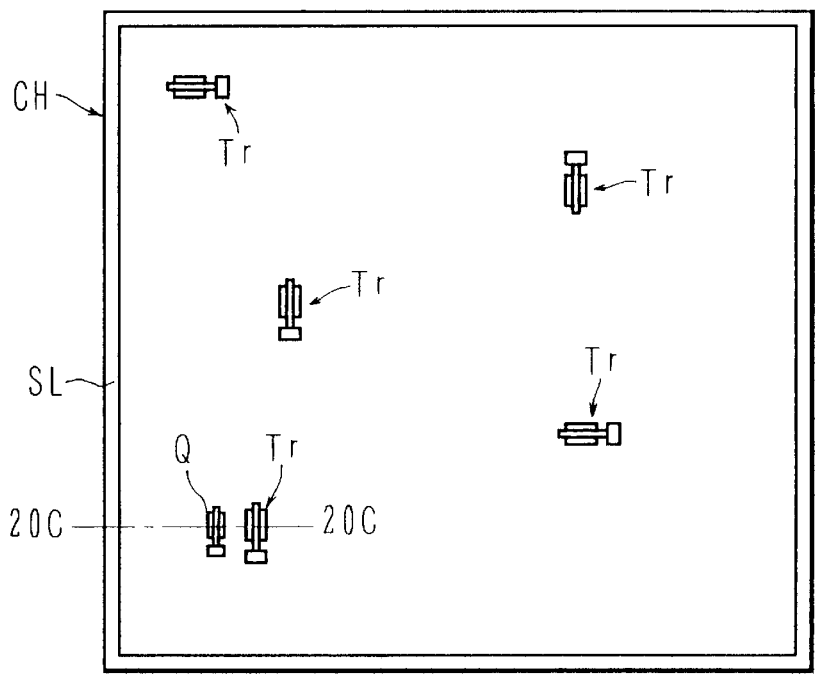
FIGS. 20A and 20C are a plan view and a cross sectional view showing the structure of a chip according to another embodiment.
Figure 20B:
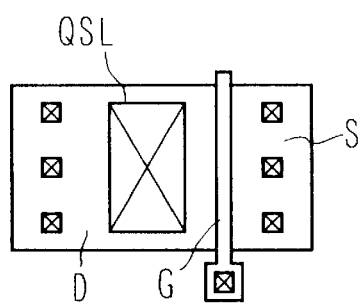
Figure 20C:
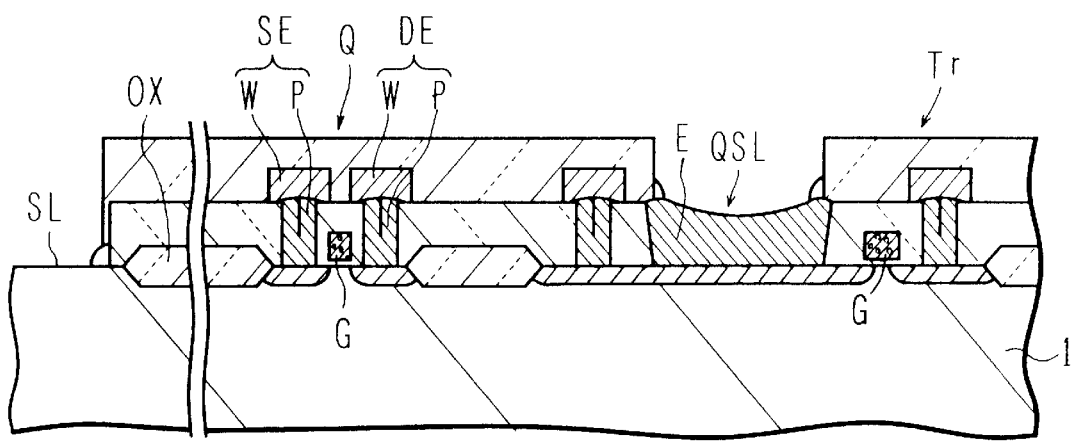

FIGS. 20A to 20C illustrate a semiconductor integrated circuit device whose input/output transistors are provided with quasi scribe lines.

FIG. 20A is a plan view of a semiconductor chip. A scribe line SL is formed at the peripheral area of the semiconductor chip CH. In the internal region surrounded by the scribe line SL, a semiconductor integrated circuit is formed.

In this integrated circuit device, input/output transistors Tr are formed not only in the peripheral area of the semiconductor chip CH but also distributively in the whole region of the semiconductor chip CH. This structure is suitable for a semiconductor integrated circuit device in which bumps are distributed over the whole region of the semiconductor chip and the semiconductor circuit is face-down bonded. A number of MOS transistors of the internal circuit inclusive of a MOS transistor Q shown in FIG. 20A are formed in the internal region.

FIG. 20B is an enlarged plan view of one input/output transistor Tr. A source region S is about 0.5 $\mu$m long in a current flow direction. A drain region D is set, for example, to 60 $\mu$m long in the current flow direction. A width (channel width) of the source region S and drain region D in the direction parallel to the gate electrode G is about 50 μm. In the drain region, a quasi scribe line QSL is formed having a size of, for example, 30 μm×40 μm. A drain contact is formed outside of the quasi scribe line QSL. In this example, three contact holes are formed in each of the source and drain regions S and D.

FIG. 20C shows the cross sectional structure taken along line 20C—20C shown in FIG. 20A. Like elements to those of the previous embodiment are represented by using identical reference numerals, and the description thereof is omitted. A MOS transistor Q of the internal circuit has a gate length of, for example, about 0.5 μm. Input/output transistors Tr have the size like that described in connection with FIG. 20B. On a quasi scribe line QSL, a conductive material layer E such as metal is formed.

FIGS. 21A to 21C and FIGS. 22D to 22F illustrate processes of manufacturing the structure such as shown in FIGS. 19 and 20C.

Figure 21A:
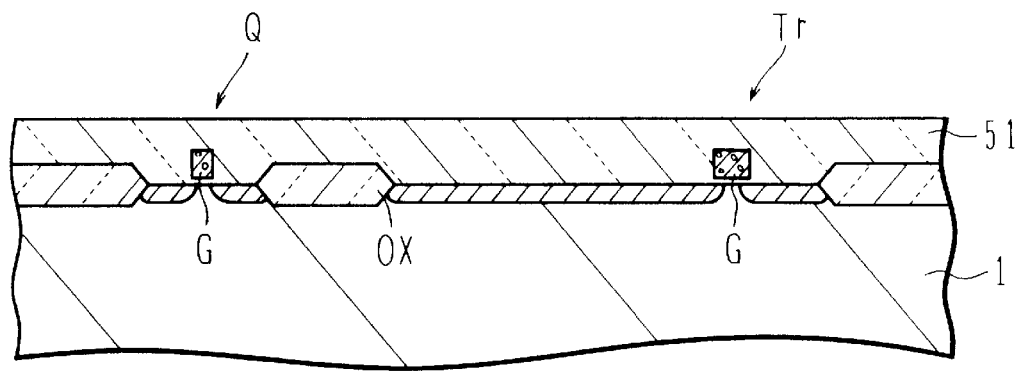
FIGS. 21A to 21C are cross sectional views illustrating processes of manufacturing a chip according to an embodiment of the invention.

As shown in FIG. 21A, on the surface of a silicon semiconductor substrate 1, a field oxide film OX is formed by LOCOS. In active regions surrounded by the field oxide film OX, transistors Q of an internal circuit and input/output transistors Tr of an input/output circuit are to be formed.

First, a gate oxide film is formed on the surface of the active regions, and thereafter a polycide layer made of polysilicon and silicide is formed and patterned to form gate electrodes G. Source and drain regions are formed on the both sides of the gate electrodes G. Next, a first interlevel insulating film 51 is formed covering the gate electrodes G. The first interlevel insulating film 51 is made of, for example, PSG.

After the first interlevel insulating film 51 is formed, the surface thereof may be planarized by chemical mechanical polishing (CMP). In this example, the surface of the first interlevel insulating film 51 planarized by CMP is shown. The thickness of the first interlevel insulating film 51 is, for example, about 2 μm as measured from the substrate surface.

Figure 21B:
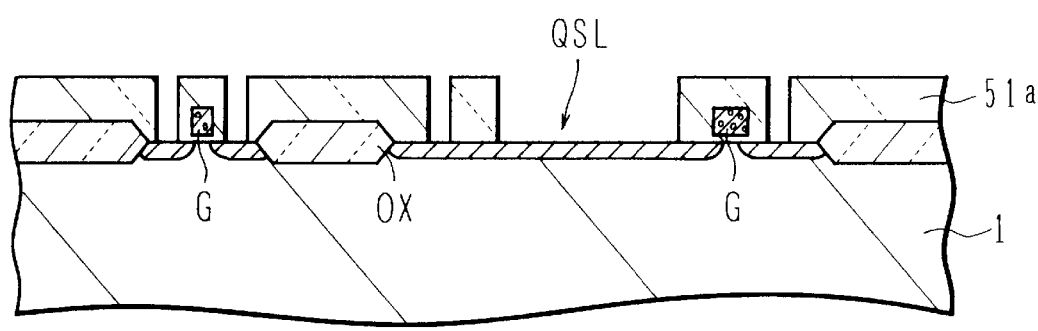

As shown in FIG. 21B, a resist mask pattern is formed on the first interlevel insulating film 51 to selectively etch the film 51 and expose a desired area of the substrate surface. FIG. 21B shows the structure after the resist mask is removed. The transistor contact hole has a diameter of 0.8 μm, and the large opening at the central area is formed for a quasi scribe line QSL. Since the aspect ratio of the contact hole is high, excessive positive charges are injected during this etching process.

Figure 21C:
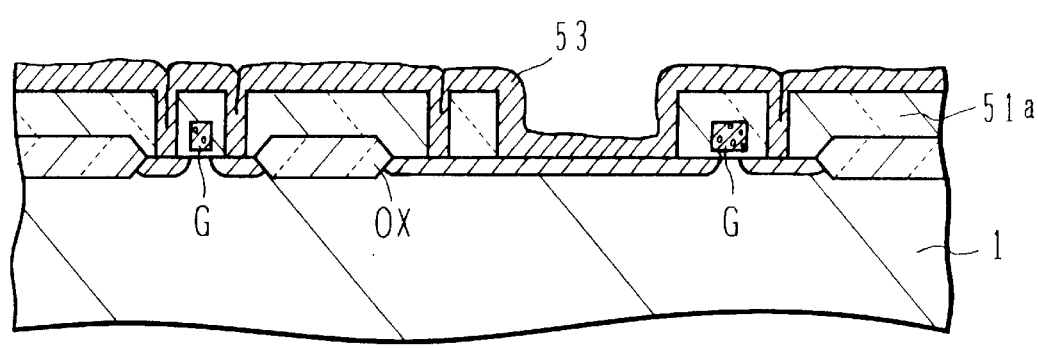

As shown in FIG. 21C, a tungsten film 53 is deposited by CVD on the whole substrate surface. The thickness of the tungsten film 53 is set such that the contact hole is completely filled with the tungsten film 53. For example, the thickness of the tungsten film 53 is about a 1.5-fold of the diameter of the contact hole.

Figure 22D:
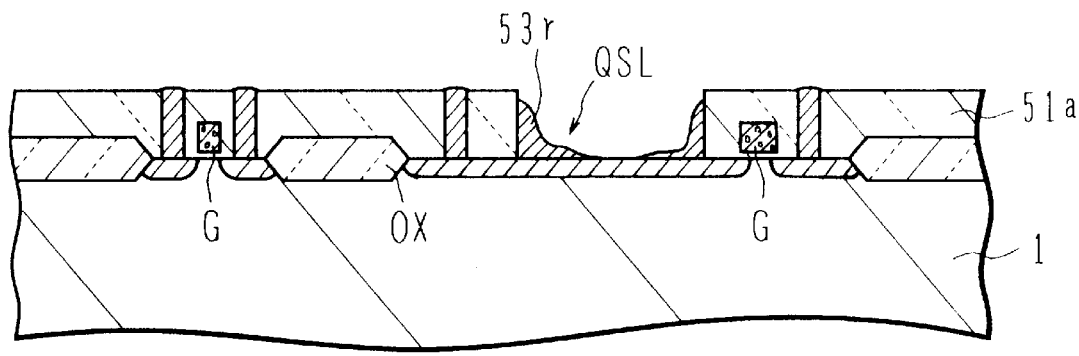
FIGS. 22D to 22F are cross sectional views illustrating processes of manufacturing the chip according to the embodiment.
Figure 22E:
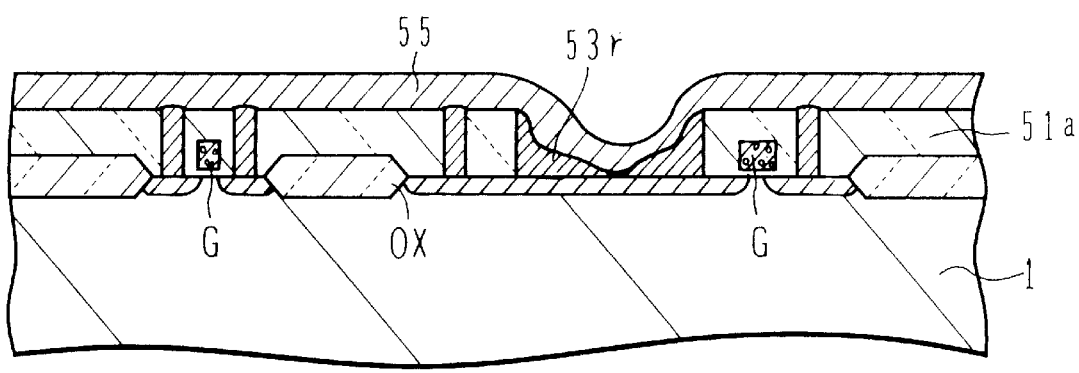

Next, as shown in FIG. 22D, the deposited tungsten film 53 is etched back. This etch-back may be performed by plasma etching, CMP, or other processes. In this example, the tungsten film 53 is etched back by CMP. The tungsten film 53 on the surface of the first interlevel insulating film 51a is almost completely removed. In a recess at the quasi scribe line QSL, the tungsten film 53 is etched only chemically so that part 53r of the film 53 is left.

Figure 22F:
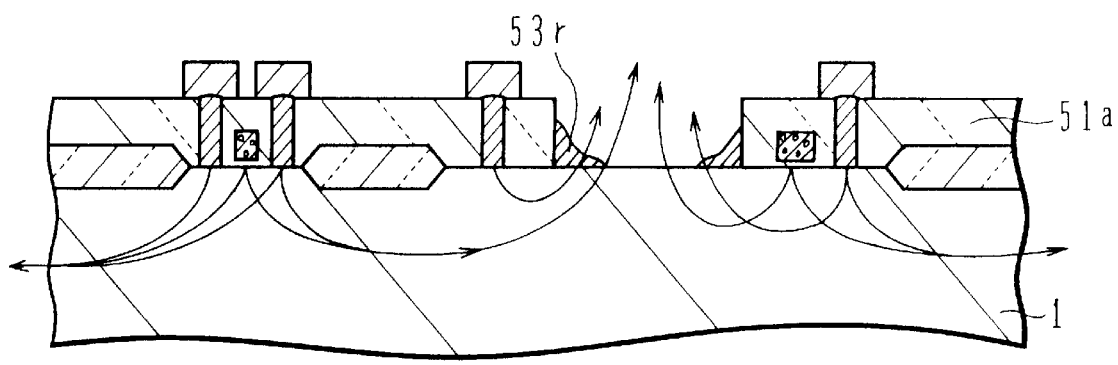

As shown in FIG. 22F, an aluminum alloy layer 55 as a wiring layer is deposited on the planarized surface by sputtering or the like. For example, the aluminum alloy layer 55 is deposited about 1 μm thick.

As shown in FIG. 22F, a resist mask pattern (not shown) is formed on the aluminum alloy layer 55 to pattern this layer 55 by plasma etching or the like. In this case, the quasi scribe line QSL is not covered with the resist mask but exposed.

During this plasma etching, if excessive positive charges are incident upon the exposed wiring layer, these charges are injected into the substrate via the contact area connected to this wiring layer or via the insulated gate electrode. These charges flow in the substrate and couple with negative and positive charges on or above the scribe line and quasi scribe lines, and are neutralized.

Even if current flows in the substrate, a potential difference generated in the substrate is small if the distance between the current input position and the current output position is short. Therefore, it is rare for the threshold voltage of the gate structure of a MOS transistor to change.

After forming the first wiring layer, a second interlevel insulating film is deposited covering the first wiring layer, and thereafter, a second wiring layer is formed. These processes can be realized by similar processes to those forming the first interlevel insulating film and first wiring layer. A third wiring layer or wiring layers at higher levels than the third wiring layer are also realized by similar processes.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A semiconductor device comprising:
   a semiconductor substrate of a first conductivity type;
   a well formed in a surface of said semiconductor substrate, said well being of a second conductivity type opposite to the first conductivity type;
   a first MOS transistor formed in a surface of a first conductivity type region of said semiconductor substrate, said first MOS transistor having a gate electrode, with a gate insulating film being interposed under the gate electrode;
   a second MOS transistor formed in a surface of said well, said second MOS transistor having a gate electrode, with a gate insulating film being interposed under the gate electrode;
   a wiring connected to the gate electrodes of said first and second MOS transistors; and
   a protection diode with a p-n junction formed in the first conductivity type region of said semiconductor substrate, and comprising a second conductivity type region electrically connected to said wiring and the first conductivity type region of said semiconductor substrate,
   wherein said wiring and said well are not connected electrically directly nor through a diode, and
   wherein a total area of said wiring is a 500-fold or more of a sum of a gate electrode area of said first MOS transistor and a gate electrode area of said second MOS transistor respectively disposed on the gate insulating film.

2. A semiconductor device comprising:
   a semiconductor substrate of a first conductivity type;
   a well formed in a surface of said semiconductor substrate, said well being of a second conductivity type opposite to the first conductivity type;
   a first MOS transistor formed in a surface of a first conductivity type region of said semiconductor substrate, said first MOS transistor having a gate electrode, with a gate insulating film being interposed under the gate electrode;

a second MOS transistor formed in a surface of said well, said second MOS transistor having a gate electrode, with a gate insulating film being interposed under the gate electrode;

a wiring connected to the gate electrodes of said first and second MOS transistors; and a protection diode with a p-n junction formed in the first conductivity type region of said semiconductor substrate, and comprising a second conductivity type region electrically connected to said wiring and the first conductivity type region of said semiconductor substrate, wherein said wiring and said well are not connected electrically directly nor through a diode, wherein said wiring is a multi-layer wiring having a plurality of wiring layers, and wherein a total area of the plurality of wiring layers of a multi-layer wiring, the plurality of wiring layers sequentially connected from the gate electrodes of said first and second MOS transistors to upper level wiring layers, is a 500-fold or more of a sum of a gate electrode area of said first MOS transistor and a gate electrode area of said second MOS transistor respectively disposed on the gate insulating film.

3. A semiconductor device comprising:

a semiconductor substrate of a first conductivity type;

a well formed in a surface of said semiconductor substrate, said well being of a second conductivity type opposite to the first conductivity type;

a first MOS transistor formed in a surface of a first conductivity type region of said semiconductor substrate, said first MOS transistor having a gate electrode, with a gate insulating film being interposed under the Rate electrode;

a second MOS transistor formed in a surface of said well, said second MOS transistor having a gate electrode, with a gate insulating film being interposed under the gate electrode;

a wiring connected to the gate electrodes of said first and second MOS transistors;

a protection diode with a p-n junction formed in the first conductivity type region of said semiconductor substrate, and comprising a second conductivity type region electrically connected to said wiring and the first conductivity type region of said semiconductor substrate, and a plurality of active regions formed on the surface of said semiconductor substrate and surrounded by a field oxide film, wherein said wiring and said well are not connected electrically directly nor through a single diode, and wherein an area of the second conductivity type region of said protection diode on the semiconductor substrate surface is equal to a smallest area on the semiconductor substrate surface among areas of impurity doped regions formed on the semiconductor substrate surface.

4. A semiconductor device, comprising:

a semiconductor substrate of a first conductivity type;

a well formed in a surface of said semiconductor substrate, said well being of a second conductivity type opposite to the first conductivity type;

a first MOS transistor formed in a surface of a first conductivity type region of said semiconductor substrate, said first MOS transistor having a gate electrode, with a gate insulating film being interposed under the gate electrode;

a second MOS transistor formed in a surface of said well, said second MOS transistor having a gate electrode, with a gate insulating film being interposed under the gate electrode;

a wiring connected to the gate electrodes of said first and second MOS transistors; and a protection diode with a p-n junction formed in the first conductivity type region of said semiconductor substrate, and comprising a second conductivity type region electrically connected to said wiring and the first conductivity type region of said semiconductor substrate, wherein said wiring and said well are not connected electrically directly nor through a single diode, and wherein a length of said wiring between said protection diode and said first MOS transistor and a length of said wiring between said protection diode and said second MOS transistor are both a half of, or shorter than, a total length of said wiring.

5. A semiconductor device comprising:

a semiconductor substrate of a first conductivity type;

a well formed in a surface of said semiconductor substrate, said well being of a second conductivity type opposite to the first conductivity type;

a first MOS transistor formed in a surface of a first conductivity type region of said semiconductor substrate, said first MOS transistor having a gate electrode, with a gate insulating film being interposed under the gate electrode;

a second MOS transistor formed in a surface of said well, said second MOS transistor having a gate electrode, with a gate insulating film being interposed under the gate electrode;

a wiring connected to the gate electrodes of said first and second MOS transistors; and a protection diode with a p-n junction formed in the first conductivity type region of said semiconductor substrate, and comprising a second conductivity type region electrically connected to said wiring and the first conductivity type region of said semiconductor substrate, wherein said wiring and said well are not connected electrically directly nor through a diode, and wherein said protection diode comprises a first conductivity type region formed to cover the entire area of the p-n junction and having an impurity concentration higher than a channel region under the gate electrode of said first MOS transistor.

6. A semiconductor device comprising:

a semiconductor substrate of a first conductivity type;

a well formed in a surface of said semiconductor substrate, said well being of a second conductivity type opposite to the first conductivity type;

a first MOS transistor formed in a surface of a first conductivity type region of said semiconductor substrate, said first MOS transistor having a gate electrode, with a gate insulating film being interposed under the gate electrode;

a second MOS transistor formed in a surface of said well, said second MOS transistor having a gate electrode, with a gate insulating film being interposed under the gate electrode;

a wiring connected to the gate electrodes of said first and second MOS transistors; and a protection diode with a p-n junction formed in the first conductivity type region of said semiconductor substrate, said protection diode comprising a second conductivity type region electrically connected to said wiring and the first conductivity type region of said semiconductor substrate, wherein said wiring and said well are not connected electrically directly nor through a diode, wherein said semiconductor device further comprises:
another diode formed in the first conductivity type region of said semiconductor substrate,
wherein a distance between said protection diode and a MOS transistor formed nearest to said protection diode is longer than, or equal to, a distance between said another diode and the MOS transistor formed nearest to said protection diode.

7. A semiconductor device comprising:

a semiconductor substrate of a first conductivity type;

a well formed in a surface of said semiconductor substrate, said well being of a second conductivity type opposite to the first conductivity type;

a first MOS transistor formed in a surface of a first conductivity type region of said semiconductor substrate, said first MOS transistor having a gate electrode, with a gate insulating film being interposed under the gate electrode;

a second MOS transistor formed in a surface of said well, said second MOS transistor having a gate electrode, with a gate insulating film being interposed under the gate electrode;

a wiring connected to the gate electrodes of said first and second MOS transistors; and a protection diode with a pen junction formed in the first conductivity type region of said semiconductor substrate, and comprising a second conductivity type region electrically connected to said wiring and the first conductivity type region of said semiconductor substrate, wherein, whenever said gate electrode has a forward bias applied with respect to said protection diode arranged between said gate electrode and said semiconductor substrate, current flows in a forward direction through said protection diode such that any charge accumulated on said gate electrode can be discharged to said substrate and, whenever said gate electrode has a reverse bias applied with respect to said protection diode with an applied voltage greater than a reverse breakdown voltage of said protection diode, current flows in a reverse direction through said protection diode such that any charge accumulated on said gate electrode can be discharged to the substrate.

8. A semiconductor device according to claim 7, further comprising:

a plurality of active regions formed on the surface of said semiconductor substrate and surrounded by a field oxide film, wherein an area of the second conductivity type region of said protection diode on the semiconductor substrate surface is equal to a smallest area on the semiconductor substrate surface among areas of impurity doped regions formed on the semiconductor substrate surface.

9. A semiconductor device according to claim 7, wherein a length of said wiring between said protection diode and said first MOS transistor and a length of said wiring between said protection diode and said second MOS transistor are both a half of, or shorter than, a total length of said wiring.

10. A semiconductor device comprising:

a semiconductor substrate of a first conductivity type;

a well formed in a surface of said semiconductor substrate, said well being of a second conductivity type opposite to the first conductivity type;

a first MOS transistor formed in a surface of a first conductivity type region of said semiconductor substrate, said first MOS transistor having a gate electrode, with a gate insulating film being interposed under the gate electrode;

a second MOS transistor formed in a surface of said well, said second MOS transistor having a gate electrode, with a gate insulating film being interposed under the gate electrode;

a wiring connected to the gate electrodes of said first and second MOS transistors; and a protection diode with a p-n junction formed in the first conductivity type region of said semiconductor substrate, said protection diode comprising a second conductivity type region electrically connected to said wiring and the first conductivity type region of said semiconductor substrate, wherein, whenever said gate electrode has a forward bias applied with respect to said protection diode arranged between said gate electrode and said semiconductor substrate, current flows in a forward direction through said protection diode such that any charge accumulated on said gate electrode can be discharged to said substrate and, whenever said gate electrode has a reverse bias applied with respect to said protection diode with an applied voltage greater than a reverse breakdown voltage of said protection diode, current flows in a reverse direction through said protection diode such that any charge accumulated on said gate electrode can be discharged to the substrate, and wherein a total area of said wiring is a 500-fold or more of a sum of a gate electrode area of said first MOS transistor and a gate electrode area of said second MOS transistor respectively disposed on the gate insulating film.

11. A semiconductor device comprising:

a semiconductor substrate of a first conductivity type;

a well formed in a surface of said semiconductor substrate said well being of a second conductivity type opposite to the first conductivity type;

a first MOS transistor formed in a surface of a first conductivity type region of said semiconductor substrate, said first MOS transistor having a gate electrode, with a gate insulating film being interposed under the gate electrode;

a second MOS transistor formed in a surface of said well, said second MOS transistor having a gate electrode, with a gate insulating film being interposed under the gate electrode;

a wiring connected to the gate electrodes of said first and second MOS transistors; and a protection diode with a p-n junction formed in the first conductivity type region of said semiconductor substrate, said protection diode comprising a second conductivity type region electrically connected to said wiring and the first conductivity type region of said semiconductor substrate, wherein, whenever said gate electrode has a forward bias applied with respect to said protection diode arranged between said gate electrode and said semiconductor substrate, current flows in a forward direction through said protection diode such that any charge accumulated on said gate electrode can be discharged to said substrate and, whenever said gate electrode has a reverse bias applied with respect to said protection diode with an applied voltage greater than a reverse breakdown voltage of said protection diode, current flows in a reverse direction through said protection diode such that any charge accumulated on said gate electrode can be discharged to the substrate, wherein said wiring is a multi-layer wiring having a plurality of wiring layers, and wherein a total area of the plurality of wiring layers of the multi-layer wiring, the plurality of wiring layers sequentially connected from the gate electrodes of said first and second MOS transistors to upper level wiring layers, is a 500-fold or more of a sum of a gate electrode area of said first MOS transistor and a gate electrode area of said second MOS transistor respectively disposed on the gate insulating film.

12. A semiconductor device comprising:

a semiconductor substrate of a first conductivity type;

a well formed in a surface of said semiconductor substrate, said well being of a second conductivity type opposite to the first conductivity type;

a first MOS transistor formed in a surface of a first conductivity type region of said semiconductor substrate, said first MOS transistor having a gate electrode, with a gate insulating film being interposed under the gate electrode;

a second MOS transistor formed in a surface of said well, said second MOS transistor having a gate electrode, with a gate insulating film being interposed under the gate electrode;

a wiring connected to the gate electrodes of said first and second MOS transistors; and a protection diode with a p-n junction formed in the first conductivity type region of said semiconductor substrate, and comprising a second conductivity type region electrically connected to said wiring and the first conductivity type region of said semiconductor substrate, wherein, whenever said gate electrode has a forward bias applied with respect to said protection diode arranged between said gate electrode and said semiconductor substrate, current flows in a forward direction through said protection diode such that any charge accumulated on said gate electrode can be discharged to said substrate and, whenever said gate electrode has a reverse bias applied with respect to said protection diode with an applied voltage greater than a reverse breakdown voltage of said protection diode, current flows in a reverse direction through said protection diode such that any charge accumulated on said gate electrode can be discharged to the substrate, wherein said protection diode comprises a first conductivity type region formed to cover the entire area of the p-n junction and having an impurity concentration higher than a channel region under the gate electrode of said first MOS transistor.

13. A semiconductor device comprising:

a semiconductor substrate of a first conductivity type;

a well formed in a surface of said semiconductor substrate, said well being of a second conductivity type opposite to the first conductivity type;

a first MOS transistor formed in a surface of a first conductivity type region of said semiconductor substrate, said first MOS transistor having a gate electrode, with a gate insulating film being interposed under the gate electrode;

a second MOS transistor formed in a surface of said well, said second MOS transistor having a gate electrode, with a gate insulating film being interposed under the gate electrode;

a wiring connected to the gate electrodes of said first and second MOS transistors; and a protection diode with a p-n junction formed in the first conductivity type region of said semiconductor substrate, and comprising a second conductivity type region electrically connected to said wiring and the first conductivity type region of said semiconductor substrate, wherein, whenever said gate electrode has a forward bias applied with respect to said protection diode arranged between said gate electrode and said semiconductor substrate, current flows in a forward direction through said protection diode such that any charge accumulated on said gate electrode can be discharged to said substrate and, whenever said gate electrode has a reverse bias applied with respect to said protection diode with an applied voltage greater than a reverse breakdown voltage of said protection diode, current flows in a reverse direction through said protection diode such that any charge accumulated on said gate electrode can be discharged to the substrate, wherein said semiconductor device further comprises:
another diode formed in the first conductivity type region of said semiconductor substrate,
wherein a distance between said protection diode and a MOS transistor formed nearest to said protection diode is longer than, or equal to, a distance between said another diode and the MOS transistor formed nearest to said protection diode.

* * * * *